US006407576B1

United States Patent
Ngai et al.

(10) Patent No.: US 6,407,576 B1
(45) Date of Patent: Jun. 18, 2002

(54) INTERCONNECTION AND INPUT/OUTPUT RESOURCES FOR PROGRAMMABLE LOGIC INTEGRATED CIRCUIT DEVICES

(75) Inventors: Tony Ngai, Campbell; Bruce Pedersen, San Jose; Sergey Shumarayev, San Leandro; James Schleicher, Santa Clara; Wei-Jen Huang, Burlingame; Michael Hutton, Palo Alto; Victor Maruri, Mountain View; Rakesh Patel; Peter J. Kazarian, both of Cupertino; Andrew Leaver, Palo Alto; David W. Mendel, Sunnyvale; Jim Park, San Jose, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/516,921

(22) Filed: Mar. 2, 2000

Related U.S. Application Data

(60) Provisional application No. 60/142,431, filed on Jul. 6, 1999, provisional application No. 60/142,508, filed on Jul. 6, 1999, provisional application No. 60/142,513, filed on Jul. 6, 1999, and provisional application No. 60/122,788, filed on Mar. 4, 1999.

(51) Int. Cl.$^7$ .............................................. H01L 25/00
(52) U.S. Cl. .............................. 326/41; 326/39; 326/47
(58) Field of Search ............................ 326/37, 38, 39, 326/41, 47

(56) References Cited

U.S. PATENT DOCUMENTS

| 3,473,160 A | 10/1969 | Wahlstrom ............... 340/172.5 |
| 4,609,986 A | 9/1986 | Hartmann et al. .......... 364/200 |
| 4,617,479 A | 10/1986 | Hartmann et al. .......... 307/465 |

(List continued on next page.)

FOREIGN PATENT DOCUMENTS

| EP | 454352 A1 | 10/1991 | ......... H03K/19/177 |
| EP | 461798 A2 | 12/1991 | ......... H03K/19/177 |
| EP | 463746 A2 | 1/1992 | ........... G06F/15/60 |
| EP | 630115 A2 | 12/1994 | ......... H03K/19/177 |
| EP | 746105 A2 | 12/1996 | ......... H03K/19/177 |

(List continued on next page.)

OTHER PUBLICATIONS

R. C. Minnick, "A Survey of Microcellular Research," Journal of the Association for Computing Machinery, vol. 14, No. 2, pp. 203–41, Apr. 1967.

(List continued on next page.)

*Primary Examiner*—Michael Tokar
*Assistant Examiner*—Anh Tran
(74) *Attorney, Agent, or Firm*—Fish & Neave; Robert R. Jackson; Andrew Van Court

(57) ABSTRACT

A programmable logic integrated circuit device has a plurality of regions of programmable logic disposed on the device in a plurality of intersecting rows and columns of such regions. Interconnection resources (e.g., interconnection conductors, signal buffers/drivers, programmable connectors, etc.) are provided on the device for making programmable interconnections to, from, and/or between the regions. At least some of these interconnection resources are provided in two forms that are architecturally similar (e.g., with similar and substantially parallel routing) but that have significantly different signal propagation speed characteristics. For example, a major or larger portion of such dual-form interconnection resources may have what may be termed normal signal speed, while a smaller minor portion may have significantly faster signal speed. Secondary (e.g., clock and clear) signal distribution may also be enhanced, and so may be input/output circuitry and cascade connections between adjacent or nearby logic modules on the device.

41 Claims, 14 Drawing Sheets

U.S. PATENT DOCUMENTS

| | | | |
|---|---|---|---|
| 4,642,487 A | 2/1987 | Carter | 307/465 |
| 4,677,318 A | 6/1987 | Veenstra | 307/465 |
| 4,713,792 A | 12/1987 | Hartmann et al. | 364/900 |
| 4,758,745 A | 7/1988 | Elgamal et al. | 307/465 |
| 4,774,421 A | 9/1988 | Hartmann et al. | 307/465 |
| 4,871,930 A | 10/1989 | Wong et al. | 307/465 |
| 4,899,067 A | 2/1990 | So et al. | 307/465 |
| 4,912,342 A | 3/1990 | Wong et al. | 307/465 |
| 5,023,606 A | 6/1991 | Kaplinsky | 340/825.8 |
| 5,073,729 A | 12/1991 | Greene et al. | 307/465.1 |
| 5,121,006 A | 6/1992 | Pedersen | 307/465 |
| 5,122,685 A | 6/1992 | Chan et al. | 307/465.1 |
| 5,132,571 A | 7/1992 | McCollum et al. | 307/465.1 |
| 5,144,166 A | 9/1992 | Camarota et al. | 307/465.1 |
| 5,208,491 A | 5/1993 | Ebeling et al. | 307/465 |
| 5,212,652 A | 5/1993 | Agrawal et al. | 364/489 |
| 5,218,240 A | 6/1993 | Camarota et al. | 307/443 |
| 5,220,214 A | 6/1993 | Pedersen | 307/465 |
| 5,225,719 A | 7/1993 | Agrawal et al. | 307/465 |
| RE34,363 E | 8/1993 | Freeman | 307/465 |
| 5,237,219 A | 8/1993 | Cliff et al. | 307/465 |
| 5,241,224 A | 8/1993 | Pedersen et al. | 307/465 |
| 5,255,203 A | 10/1993 | Agrawal et al. | 364/489 |
| 5,258,668 A | 11/1993 | Cliff et al. | 307/465 |
| 5,260,610 A | 11/1993 | Pedersen et al. | 307/465 |
| 5,260,611 A | 11/1993 | Cliff et al. | 307/465 |
| 5,274,581 A | 12/1993 | Cliff et al. | 364/784 |
| 5,338,984 A | 8/1994 | Sutherland | 307/465.1 |
| 5,350,954 A | 9/1994 | Patel | 307/465 |
| 5,371,422 A | 12/1994 | Patel et al. | 326/41 |
| 5,381,058 A | 1/1995 | Britton et al. | 326/41 |
| 5,448,186 A | 9/1995 | Kawata | 326/41 |
| 5,455,525 A | 10/1995 | Ho et al. | 326/41 |
| 5,467,029 A | 11/1995 | Taffe et al. | 326/41 |
| 5,469,003 A | 11/1995 | Kean | 326/39 |
| 5,483,178 A | 1/1996 | Costello et al. | 326/41 |
| 5,509,128 A | 4/1996 | Chan | 395/311 |
| 5,537,341 A | 7/1996 | Rose et al. | 364/579 |
| 5,543,732 A | 8/1996 | McClintock et al. | 326/41 |
| 5,550,782 A | 8/1996 | Cliff et al. | 365/230.03 |
| 5,555,214 A | 9/1996 | Sung et al. | 365/221 |
| 5,565,793 A | 10/1996 | Pedersen | 326/41 |
| 5,631,576 A | 5/1997 | Lee et al. | 326/39 |
| 5,633,830 A | 5/1997 | Sung et al. | 365/221 |
| 5,642,082 A | 6/1997 | Jefferson | 331/25 |
| 5,650,734 A | 7/1997 | Chu et al. | 326/38 |
| 5,670,895 A | 9/1997 | Kazarian et al. | 326/39 |
| 5,689,195 A | 11/1997 | Cliff et al. | 326/41 |
| 5,699,020 A | 12/1997 | Jefferson | 331/17 |
| 5,699,312 A | 12/1997 | Wong | 365/226 |
| 5,705,939 A | 1/1998 | McClintock et al. | 326/41 |
| 5,717,901 A | 2/1998 | Sung et al. | 395/497.01 |
| 5,764,080 A | 6/1998 | Huang et al. | 326/41 |
| 5,802,540 A | 9/1998 | Sung et al. | 711/1 |
| 5,828,229 A | 10/1998 | Cliff et al. | 326/40 |
| 5,835,998 A | 11/1998 | Pedersen | 326/40 |
| 5,847,617 A | 12/1998 | Reddy et al. | 331/57 |
| 5,872,463 A | 2/1999 | Pedersen | 326/41 |
| 5,883,850 A | 3/1999 | Lee et al. | 365/230.03 |
| 5,909,126 A | 6/1999 | Cliff et al. | 326/41 |
| 5,944,813 A | 8/1999 | Trimberger | 712/36 |
| 6,020,759 A | 2/2000 | Heile | 326/40 |
| 6,069,490 A * | 5/2000 | Ochotta et al. | 326/41 |

FOREIGN PATENT DOCUMENTS

| | | | | |
|---|---|---|---|---|
| GB | 2283602 A | 5/1995 | | H03K/19/177 |
| GB | 2300950 A | 11/1996 | | H03K/19/177 |
| GB | 2311885 A | 10/1997 | | H03K/19/177 |
| WO | WO 94/10754 | 5/1994 | | H03K/19/177 |
| WO | WO 95/04404 | 2/1995 | | H03K/19/177 |
| WO | WO 95/22205 | 8/1995 | | H03K/19/177 |
| WO | WO 95/30952 | 11/1995 | | G06F/7/38 |

OTHER PUBLICATIONS

S. E. Wahlstrom, "Programable Logic Arrays—Cheaper by the Millions," Electronics, Dec. 11, 1967, pp. 90–95.

*Recent Developments in Switching Theory*, A. Mukhopadhyay, ed., Academic Press, New York, 1971, chapters VI and IX, pp. 229–254 and 369–422.

*The Programmable Gate Array Data Book*, 1988, Xilinx, Inc., San Jose, CA.

El Gamal et al., "An Architecture for Electrically Configurable Gate Arrays," IEEE Journal of Solid State Circuits, vol. 24, No. 2, Apr. 1989, pp. 394–98.

El–Ayat et al., "A CMOS Electrically Configurable Gate Array," IEEE Journal of Solid–State Circuits, vol. 24, No. 3, Jun. 1989, pp. 752–62.

*ACT Family Field Programmable Gate Array Databook*, Apr. 1992, Actel Corporation, Sunnyvale, CA, pp. 1–35 through 1–44.

"ATT ORCA Series Field–Programmable Gate Arrays," AT&T Corporation, Apr. 21, 1992.

Optimized Reconfigurable Cell Array (ORCA) Series Field Programmable Gate Arrays, Advanced Data Sheet, AT&T Microelectronics, Feb. 1993.

J.He and J. Rose, "Technology Mapping for Heterogeneous FPGAs," FPGA '94, 2nd International ACM/SIGDA Workshop on Field–Programmable Gate Arrays, Berkeley, California, Feb. 13–15, 1994.

Optimized Reconfigurable Cell Array (ORCA) Series Field–Programmable Gate Arrays (ATT1C03, ATT1C05, ATT1C07), Data Sheet, AT&T Microelectronics, Mar. 1994.

*The Programmable Logic Data Book*, 1994, Xilinx, Inc., San Jose, CA, pp. 2–7, 2–12, and 2–13.

K.C.K. Chung, "Architecture and Synthesis of Field–Programmable Gate Arrays with Hard–wired Connections," Ph.D. thesis, University of Toronto, Toronto, Canada, 1994.

"XC5000 Logic Cell Array Family, Technical Data, Advance Information," Xilinx, Inc., Feb. 1995.

"Optimized Reconfigurable Cell Array (ORCA) OR2TxxA Series Field–Programmable Gate Arrays," Microelectronics Product Brief, Lucent Technologies Inc., May 1996.

"Optimized Reconfigurable Cell Array (ORCA) OR3Cxx/OR3Txxx Series Field–Programmable Gate Arrays," Preliminary Product Brief, Microelectronics Group, Lucent Technologies Inc., Nov. 1997.

"VFI FPGA Family (Preliminary)," Vantis Corporation, Sunnyvale, CA, Nov. 1998.

J. Cong et al., "Boolean Matching for Complex PLBs in LUT–based FPGAs with Application to Architecture Evaluation," FPGA '98, ACM/SIGDA International Symposium on Field Programmable Gate Arrays, Monterey, CA, 1998, pp. 27–34.

V. Betz et al., "FPGA Routing Architecture: Segmentation and Buffering to Optimize Speed and Density," FPGA 99 Monterey, CA USA, ACM 1999.

* cited by examiner

INTERCONNECTION AND INPUT/OUTPUT RESOURCES FOR PROGRAMMABLE LOGIC INTEGRATED CIRCUIT DEVICES

This application claims the benefit of U.S. provisional patent application No. 60/122,788, filed Mar. 4, 1999, U.S. provisional patent application No. 60/142,431, filed Jul. 6, 1999, U.S. provisional patent application No. 60/142,508, filed Jul. 6, 1999, and U.S. provisional patent application No. 60/142,513, filed Jul. 6, 1999, all of which are hereby incorporated by reference herein in their entireties.

BACKGROUND OF THE INVENTION

This invention relates to programmable logic array integrated circuit devices ("programmable logic devices" or "PLDs"), and more particularly to interconnection resources for use on programmable logic devices that increase the speed at which those devices can be made to operate. The invention also relates to such other features of PLDs as secondary signal (e.g., clock and clear signal) distribution, input/output circuitry, and cascade connections between logic modules.

Programmable logic devices typically include (1) many regions of programmable logic, and (2) programmable interconnection resources for selectively conveying signals to, from, and/or between those logic regions. Each logic region is programmable to perform any of several different, relatively simple logic functions. The interconnection resources are programmable to allow the logic regions to work together to perform much more complex logic functions than can be performed by any individual logic region. Examples of known PLDs are shown in Wahlstrom U.S. Pat. No. 3,473,160, Freeman U.S. Patent Re. No. 34,363, Cliff et al. U.S. Pat. No. 5,689,195, Cliff et al. U.S. Pat. No. 5,909,126, and Jefferson et al. U.S. Pat. No. 6,215,326, all of which are hereby incorporated by reference herein in their entireties.

A typical measure of the maximum speed at which a PLD can be made to operate is the longest time required for a signal to propagate through the device from the register of any logic region (or other resource with a register) to the register of any other logic region (or other resource with a register). A PLD cannot be safely clocked at a clock rate having a period less than this longest signal propagation time. An important design objective for most PLDs is to minimize the longest signal propagation time. Thus both the logic regions and the interconnection resources are typically designed to be time-efficient in this respect. Once this has been done, however, for a given integrated circuit fabrication technology, it is difficult to significantly further reduce the longest signal propagation time. For example, to increase the speed of interconnection resources, bigger drivers and pass transistors can be used, but the corresponding diffusion loading on the routing channels will also increase. Wider metal tracks can be used for interconnection conductors to reduce metal RC delay, but this will increase die size substantially. As a result, the final speed-up is diminished.

In view of the foregoing, it is an object of this invention to provide improved programmable logic devices.

It is a more particular object of this invention to provide improved interconnection resources for programmable logic devices.

It is a still more particular object of this invention to provide interconnection resources for programmable logic devices which reduce the longest signal propagation time characteristic of the device without the disadvantages associated with simply increasing the speed of all of those resources.

It is yet another object of this invention to improve PLDs with respect to such features as secondary (e.g., clock and clear) signal distribution, input/output circuitry, and circuitry for cascading two or more logic modules together.

SUMMARY OF THE INVENTION

These and other objects of the invention are accomplished in accordance with the principles of the invention by providing a programmable logic device with interconnection resources that are at least partly constructed in two substantially parallel forms or subsets. The interconnection resources in the first subset are constructed to have what may be termed "normal" signal propagation speed characteristics. The interconnection resources in the substantially parallel second subset are constructed to have significantly faster signal propagation speed characteristics. For example, as compared to the first subset, the second subset may be constructed with larger drivers and pass gates, wider and more widely spaced metal tracks for conductors, and other similar features for increasing signal propagation speed. Where both forms of interconnection resources are provided, most of the resources are preferably of the normal-speed variety and only a minority (e.g., from about 20% to about 33%, most preferably about 25%) are of the high-speed form.

The high-speed interconnection resources are preferably sufficiently extensively provided on the device so that they can be used for at least part of the routing of signals between substantially any two (or more) of the logic regions on the device. (It will be appreciated, of course, that the high-speed resources are likely to be of greatest value and therefore to find the greatest use in making connections between logic regions that are relatively far apart on the device.) Thus interconnections between logic regions in virtually any locations on the device can be made either entirely via the normal-speed interconnection resources or at least partly via the high-speed interconnection resources.

A typical design objective for the high-speed resources is to make it possible to double the speed at which the device can be clocked by providing a sufficient quantity of sufficiently fast high-speed resources so that those resources can be used to convey the signals that give the device its longest signal propagation time and to thereby halve the propagation time of those signals. On the other hand, to avoid the disadvantages of simply trying to greatly increase the speed of all the interconnection resources on the device, only a minor portion of the interconnection resources of any given kind are made high-speed. The major portion remain normal-speed and are used for the bulk of the interconnections that are less speed-critical.

The input/output ("I/O") circuitry of PLDs may be improved in accordance with the invention by providing rows of I/O cells (including I/O pins) interspersed among the rows of logic and other circuitry on the device. This distributes the I/O pins more uniformly across the device, thereby alleviating I/O pin shortages that can result from having I/O pins only around the periphery of the device. Distributing I/O pins across the device can also facilitate secondary (e.g., clock and clear) signal distribution (e.g., with reduced skew) by allowing such signals to come from I/O pins closer to the center of the device. Secondary signal distribution circuitry can be provided to take advantage of such improved I/O pin distribution. Cascade connections between adjacent or nearby logic regions may be improved to speed up such connections, to increase their utility, and to decrease their burden on the device when they are not being used.

Further features of the invention, its nature and various advantages will be more apparent from the accompanying drawings and the following detailed description of the preferred embodiments.

BRIEF DESCRIPTION OF THE DRAWINGS

FIGS. 7A and 7B are sometimes referred to collectively as FIG. 7.

DETAILED DESCRIPTION OF THE PREFERRED EMBODIMENTS

Figure 1:
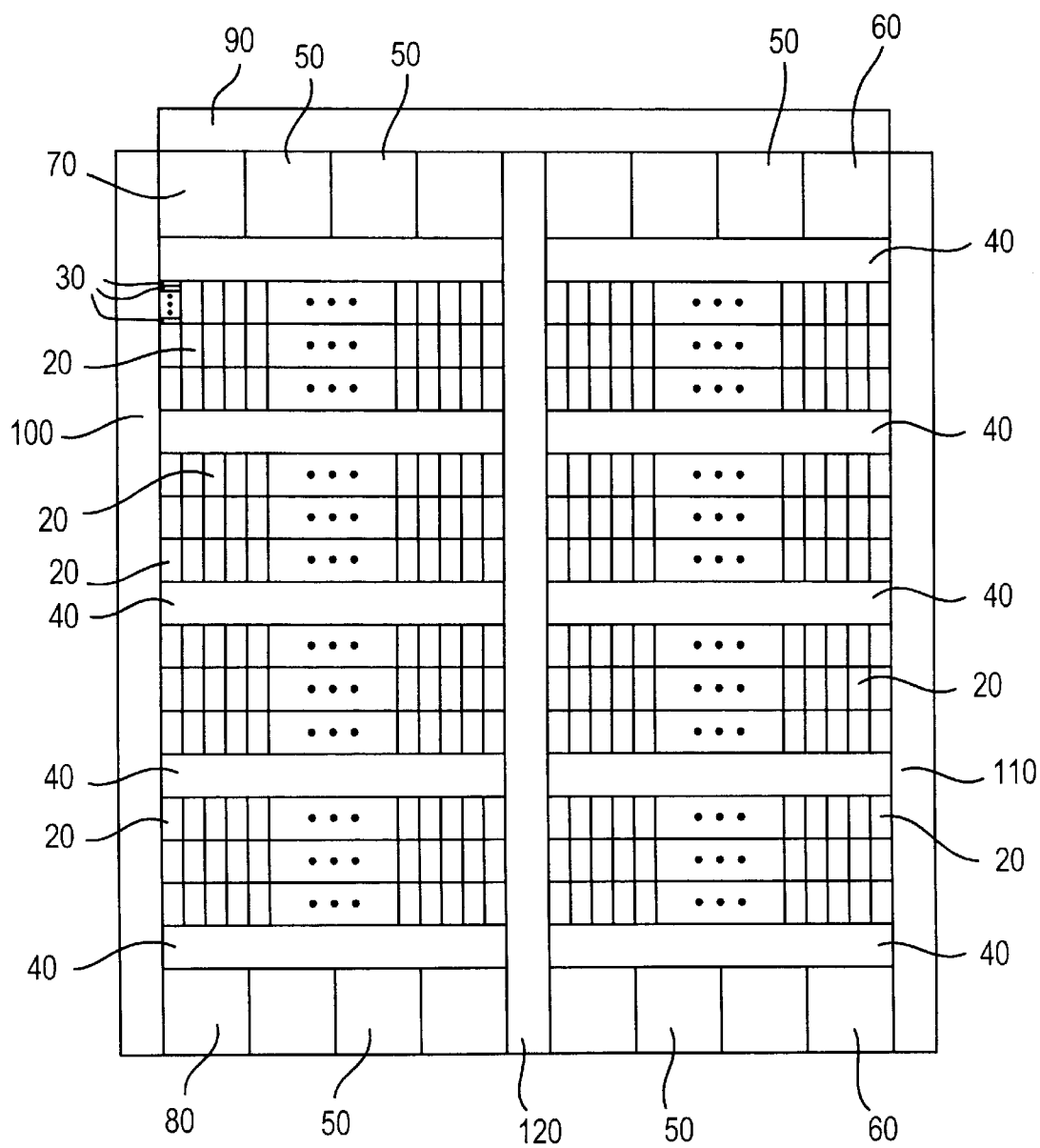
FIG. 1 is a simplified block diagram of an illustrative programmable logic device that can be constructed in accordance with the invention.

An illustrative programmable logic device 10, which can be constructed in accordance with this invention, is shown in FIG. 1. Device 10 includes 12 rows of regions 20 of programmable logic. Each row includes 40 regions 20. Thus regions 20 are disposed on device 10 in a two-dimensional array of 12 rows intersecting 40 columns of regions 20.

Each region 20 includes ten subregions 30 of programmable logic. To avoid over-complicating FIG. 1, the individual subregions 30 are delineated only in the extreme upper-left-hand region 20. As will explained more fully later in this specification, each subregion 30 is programmable by a user of device 10 to perform any of several relatively small logic functions. Extremely complex logic functions can be performed by concatenating subregions 30 via a programmable network of interconnection conductors and other associated interconnection resources on device 10.

Interspersed among the rows of regions 20 are five rows of input/output ("I/O") pins and associated I/O circuitry 40. One of I/O rows 40 is at the top of the rows of regions 20. Another I/O row 40 is at the bottom of the rows of regions 20. A third I/O row 40 is between the third and fourth rows of regions 20. A fourth I/O row 40 is between the sixth and seventh rows of regions 20. A fifth I/O row 40 is between the ninth and tenth rows of regions 20.

Above the top I/O row 40 is a row of memory regions 50 that can be used by the user of device 10 as random access memory ("RAM"), read-only memory ("ROM"), product-term ("p-term") logic, content addressable memory, etc. Another similar row of memory regions 50 is provided below bottom I/O row 40. Suitable circuitry for memory regions 50 is shown in such references as Cliff et al. U.S. Pat. No. 5,550,782, Sung et al. U.S. Pat. No. 5,555,214, Sung et al. U.S. Pat. No. 5,633,830, Cliff et al. U.S. Pat. No. 5,689,195, Sung et al. U.S. Pat. No. 5,717,901, Sung et al. U.S. Pat. No. 5,802,540, Heile U.S. Pat. No. 6,202,759, Pedersen U.S. Pat. No. 6,072,332, Reddy et al. U.S. Pat. No. 6,052,327, Reddy et al. U.S. patent application Ser. No. 09/107,926, Ngai et al. U.S. patent application Ser. No. 09/124,649, Heile U.S. Pat. No. 6,144,573, and Heile U.S. patent application Ser. No. 09/389,995, all of which are hereby incorporated by reference herein in their entireties.

At the right-hand end of each row of memory regions 50 is a region 60 of phase-locked loop circuitry which can be used to generate clock signals that are shifted in phase relative to clock signals that are applied to device 10 from external circuitry that is not shown in FIG. 1. Suitable phase-locked loop circuitry is shown in such references as Jefferson U.S. Pat. No. 5,642,082, Jefferson U.S. Pat. No. 5,699,020, Reddy et al. U.S. Pat. No. 5,847,617, Sung et al. U.S. patent application Ser. No. 09/366,940, Sung et al. U.S. Pat. No. 6,252,419, Sung et al. U.S. Pat. No. 6,218,876, and Sung et al. U.S. Pat. No. 6,177,844, all of which are hereby incorporated by reference herein in their entireties.

At the left-hand end of the top row of regions 50 is a region 70 of control logic and pins. This circuitry is used for controlling device 10 during programming and test of the device prior to its use in normal logic operations.

At the left-hand end of the bottom row of regions 50 is a region 80 of JTAG logic and pins. The circuitry of region 80 can be used by the user of the device for in-system programming and test of device 10 prior to use of the device in normal logic operations. Suitable circuitry for use in region 80 is shown in such references as Chu et al. U.S. Pat. No. 5,650,734 and Wong U.S. Pat. No. 5,699,312, both of which are hereby incorporated by reference herein in their entireties.

The top-most row of circuitry shown in FIG. 1 is address and clear register circuitry 90 that is used during programming of device 10 prior to normal logic operations. The left-most column of circuitry shown in FIG. 1 is data register circuitry 100 that is used during programming prior to normal logic operations. The right-most column of circuitry shown in FIG. 1 is test register circuitry 110 that is also used during programming prior to normal logic operations. In typical use, programming data is loaded into circuitry 100 from external circuitry that is not shown. This data flows from left to right across device 10 for storage in a vertical slice of locations determined by address information in circuitry 90. Data for use in confirming that device 10 is properly programmable and/or properly operable can be read out of device 10 via registers 110. See Cliff U.S. Pat. No. 5,237,219 (which is hereby incorporated by reference herein in its entirety) for illustrative circuitry suitable for the programing and test aspects of device 10 described in the preceding sentences and in the earlier paragraph describing region 70.

Figure 7A:
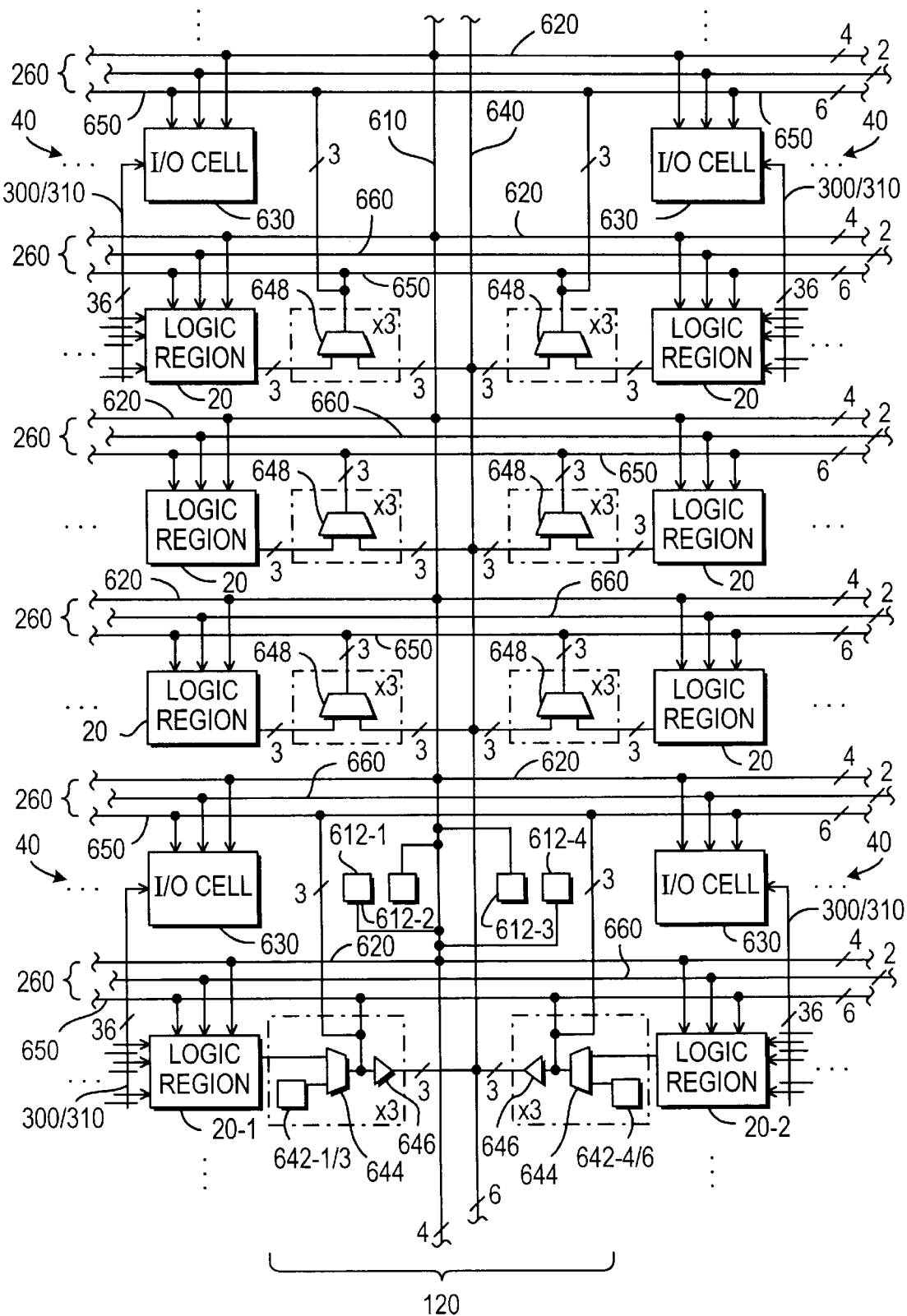
FIG. 7A is a more detailed but still simplified schematic block diagram of an illustrative embodiment of other representative portions of the FIG. 1 circuitry in accordance with the invention.
Figure 7B:
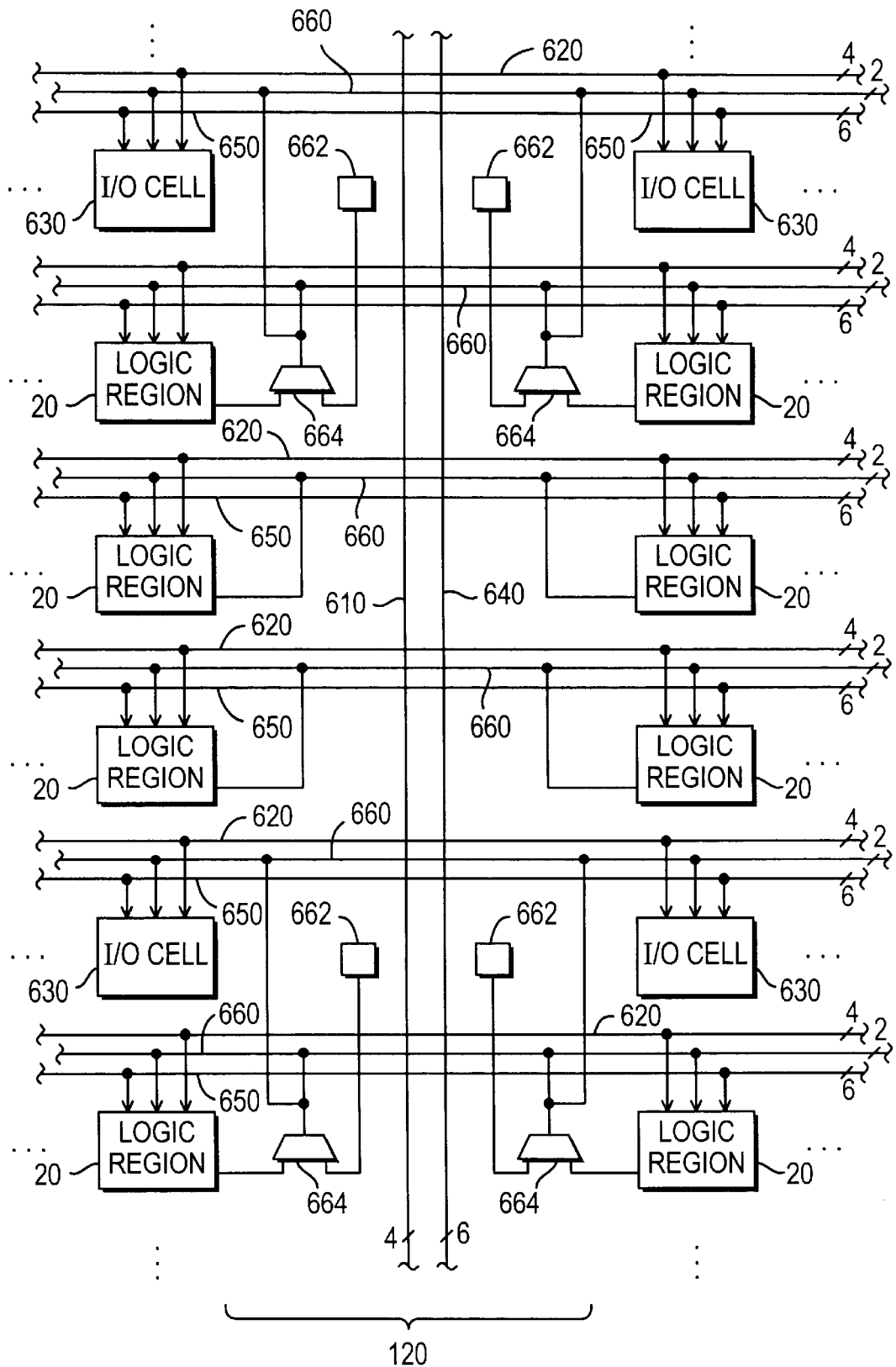
FIG. 7B is similar to FIG. 7A, but shows additional elements associated with the FIG. 7A circuitry that could not be shown in FIG. 7A without over-crowding FIG. 7A.

The only aspect of what is shown in FIG. 1 that has not yet been mentioned is a vertically aligned region 120 of so-called secondary signal conductor resources located at or near the left-to-right center of device 10. Region 120 is part of a network of signal propagation resources that is used for distributing widely needed signals throughout device 10. Examples of such signals include clock signals, clear signals, set signals, reset signals, and the like. An illustrative embodiment of region 120 and associated circuitry is shown in FIGS. 7A and 7B and described later in this specification.

In general, programming and test modes and circuitry are substantially unrelated to the present invention, and so it will not be necessary to show or describe those aspects of device 10 in further detail. This applies to elements 70, 80, 90, 100, and 110. Suitable constructions and techniques for these aspects of the device are well known to those skilled in the art, and examples are contained in other references are identified earlier in this specification. The construction, operation, and use of phase-locked loop circuitry 60 are also substantially unrelated to this invention, which obviates the need for further details regarding those circuits. Again, suitable phase-locked loop circuits are well known to those skilled in the art, and examples will be found in other references that are identified earlier in this specification. The invention can be extended to serve memory regions 50, but such possible extension will be apparent from the following explanation, which deals mainly with application of the invention to logic regions 20, I/O regions 40, and interconnections among those logic and I/O regions. Thus again it will not be necessary herein to go into much further detail regarding memory regions 50.

Figure 2:
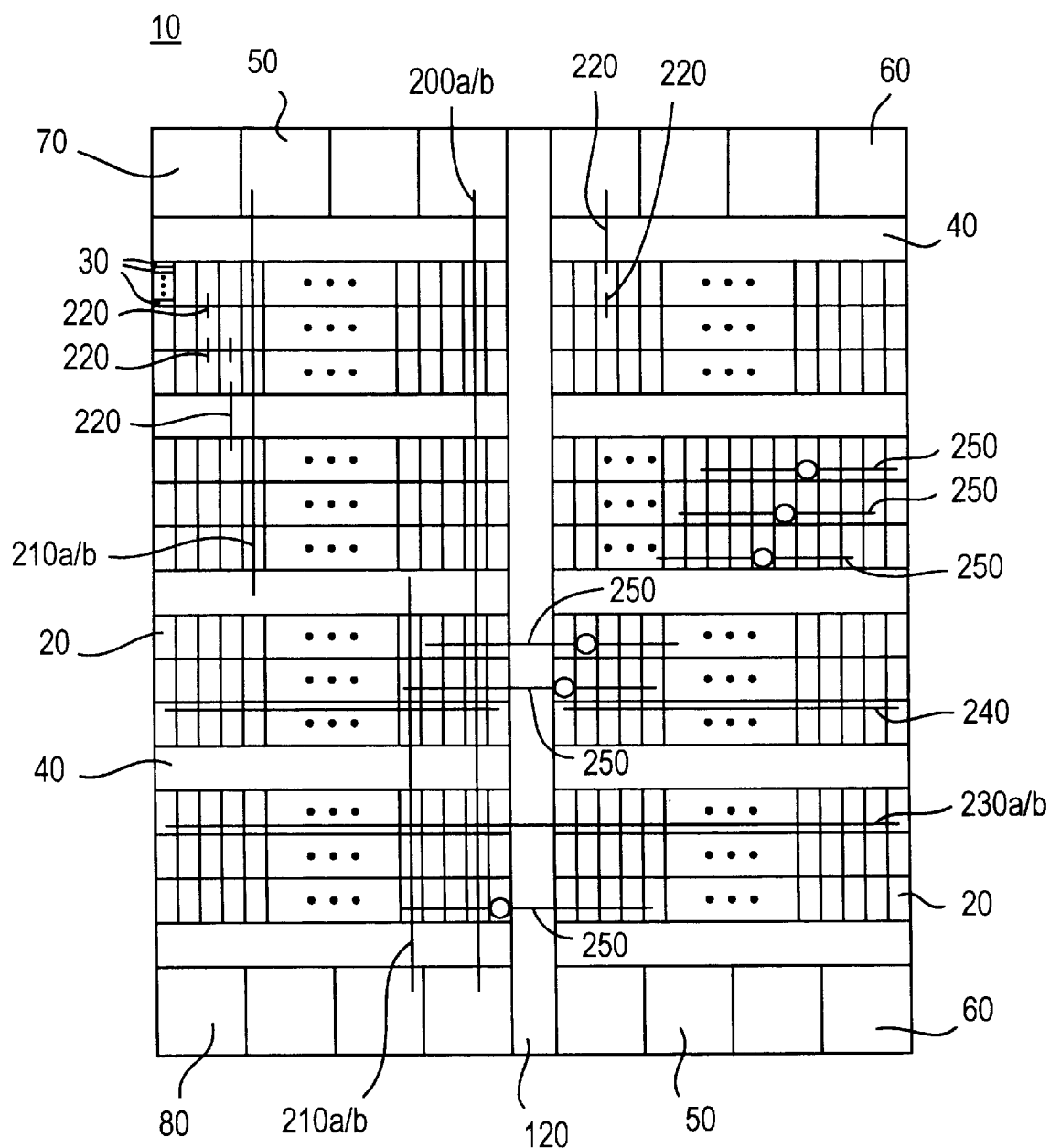
FIG. 2 shows a portion of FIG. 1 with the addition of representative, illustrative interconnection resources in accordance with the invention.

FIG. 2 is similar to a portion of FIG. 1, but shows some of the interconnection resources that are provided on device 10. Associated with each column of logic regions 20, and extending into memory rows 50, is a plurality of so-called global vertical conductors 200. Only some representative conductors 200 are shown in FIG. 1 to avoid over-crowding the drawing. Each group of conductors 200 includes a relatively large subset of such conductors designated 200a that have normal signal propagation speed characteristics. Each group of conductors 200 also includes a relatively small subset of such conductors designated 200b that have significantly faster signal propagation speed characteristics. For example, each subset 200a may comprise approximately 67–80% (most preferably about 75%) of the associated set of conductors 200, and each subset 200b may comprise approximately 20–33% (most preferably about 25%) of the associated set of conductors 200.

Associated with the upper half of each column of logic regions 20, and extending into the upper row of memory regions 50, is a plurality of so-called half vertical interconnection conductors 210. Similar half vertical interconnection conductors 210 are associated with the lower half of each column of logic regions 20 and the lower row of memory regions 50. Again, only some representative conductors 210 are shown to avoid over-crowding the drawing. As in the case of conductors 200, each set of conductors 210 includes a relatively large subset 210a of normal-speed conductors and a relatively small subset 210b of higher-speed conductors. The ratio of conductors 210a to conductors 210b may be similar to the ratio of conductors 200a to 200b.

Also associated with each column of logic regions 20 are pluralities of so-called interleaved vertical ("IV") conductors 220. Once again, only some representative conductors 220 are shown to avoid over-crowding the drawing. Each group of conductors 220 extends between vertically adjacent logic regions 20 and memory regions 50, extending across any intervening I/O region 40. Whereas conductors 200 and 210 are useful for conveying signals between any of the rows of elements 20, 40, and 50 that they cross, conductors 220 are useful for speeding up connections between vertically adjacent elements 20 and 50, and for additionally helping to reduce the numbers of conductors 200 and 210 that must be provided to satisfy the need for vertical interconnectivity on device 10. Additional details regarding IV conductors can be found in Scheicher et al. U.S. patent application Ser. No. 09/517,146, filed Mar. 2, 2000, which is hereby incorporated by reference herein in its entirety.

Associated with each row of logic regions 20 is a plurality of so-called global horizontal interconnection conductors 230. Only some representative conductors 230 are shown to avoid over-crowding the drawing. Each set of conductors 230 includes a relatively large subset 230a of normal-speed conductors and a relatively small subset 230b of significantly faster conductors. The ratio of normal to fast conductors 230 may be similar to previously described ratios of normal to fast conductors.

Associated with and extending along the left half of each row of logic regions 20 is a plurality of so-called half or direct horizontal interconnection conductors 240. Similar half horizontal conductors 240 extend along the right half of each row of logic regions 20. Once again, only a few representative conductors 240 are shown to avoid over-crowding the drawing.

Also associated with each row of logic regions 20 are several pluralities of so-called HNFL (horizontal network of fast lines) interconnection conductors 250. Except at the ends of the rows, where some HNFL conductors are necessarily shorter, each group of HNFL conductors 250 spans 10 logic regions 20. In addition, the conductors in each group of HNFL conductors 250 are drivable only by the logic region 20 or other signal sources at the center of that group (exceptions again being made at the ends of the rows). Whereas conductors 230 and 240 are useful for conveying signals between any of the logic regions 20 that they span, conductors 250 are usable only to convey signals from the logic region 20 or other signal sources that are central to the group that includes that conductor to the fixed number of logic regions to the left and/or right of the central logic region. Each logic region 20 in each row is the central/driving logic region for an associated plurality of conductors 250. Additional details regarding HNFL conductors can be found in Scheicher et al. U.S. patent application Ser. No. 09/517,146, filed Mar. 2, 2000, which is hereby incorporated by reference herein in its entirety.

Figure 3:
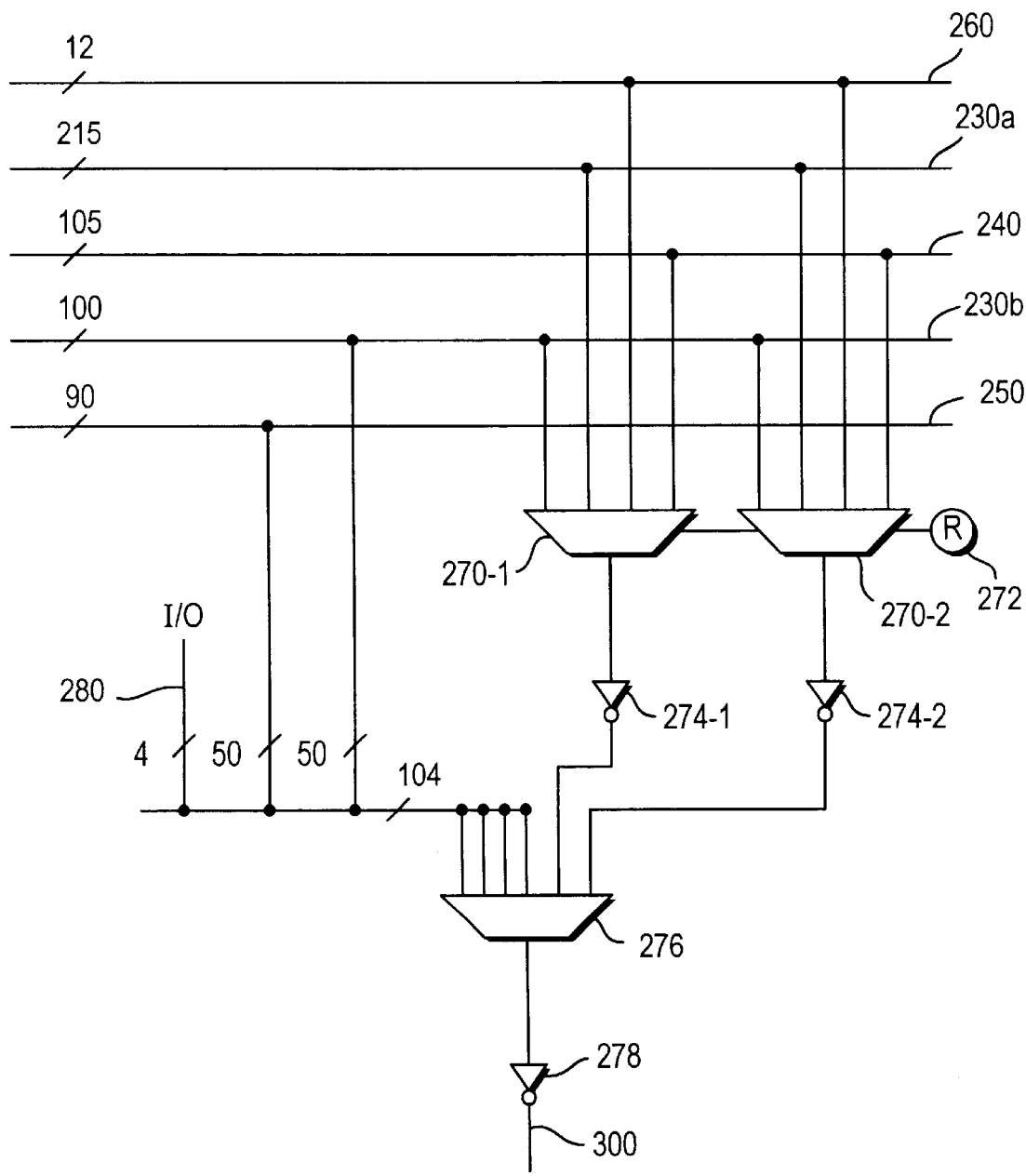
FIG. 3 is a simplified schematic block diagram of additional representative, illustrative interconnection resources for use on the device of FIGS. 1 and 2 in accordance with the invention.

FIG. 3 shows representative interconnectivity and circuitry for conveying signals from horizontal conductors associated with a row of logic regions 20 to logic regions in that row. FIG. 3 shows that there are 215 normal-speed global horizontal conductors 230a passing near a logic region, 100 fast global horizontal conductors 230b passing near that logic region, 105 half horizontal conductors 240 passing near the logic region, 90 HNFL conductors 250 passing near the logic region, and 12 secondary conductors 260 passing near the logic region. As noted earlier, the last-mentioned secondary conductors 260 may convey signals such as clocks, clears, and the like. Some of these signals 260 may come from central secondary signal region 120 (FIG. 1); others may be generated more locally (e.g., in the adjacent row of logic regions 20) and may be usable only in the locale of the source (i.e., the source row) (see the later discussion of FIGS. 7A and 7B for more details).

FIG. 3 further shows a representative logic-region-feeding conductor 300. Depicted conductor 300 is one of a group of 26 similar conductors that are disposed between two horizontally adjacent logic regions 20 in the logic region row served by the depicted conductors 230a, 230b, etc. Similar groups of 26 conductors 300 are interleaved between all horizontally adjacent logic regions 20 in all logic region rows.

For each conductor 300, selected ones of conductors 230a, 230b, 240, and 260 are connected to inputs of two programmable logic connectors ("PLCs"; e.g., multiplexers) 270-1 and 270-2. PLCs 270 are each typically controlled by programmable function control elements ("FCEs") 272 to apply to their output the signal on any one of their inputs. (Although shown with four inputs, it will be understood that each PLC 270 may have fewer or more than four inputs (e.g., two, three, six, seven, or eight inputs).) The output signal of each PLC 270 is applied to a respective inverting buffer (amplifier) 274, and thence to a respective input of PLC 276. The other inputs to PLC 276 come from selected ones of adjacent conductors 230b and 250 and (via leads 280) from an associated I/O region 40 (if any). PLC 276 is controlled by FCEs (not shown, but similar to FCEs 272) to apply to its output the signal on any one of its inputs. The output signal of PLC 276 is applied to conductor 300 via inverting buffer 278. The above-mentioned association of I/O regions 40 and logic regions 20 is as follows: top rows 20 and 40, second row 40 and fourth row 20, third row 40 and seventh row 20, fourth row 40 and tenth row 20, and fifth row 40 and twelfth row 20.

The interconnectivity shown in FIG. 3 is preferably such that each of the depicted conductors 230, 240, 250, 260, and 280 adjacent to a logic region 20 has a way to get to at least one conductor 300 to the left or right of that logic region. In addition, each conductor 230b and 250 has a way to get to at least one conductor 300 to the left or right of the logic region directly via a PLC 276 and without having to pass through a PLC 270. This last point is significant because conductors 230b and 250 are optimized for speed, and it is faster for a signal to get to a conductor 300 via only elements 276 and 278, rather than having to also pass through elements 270 and 274.

Figure 4:
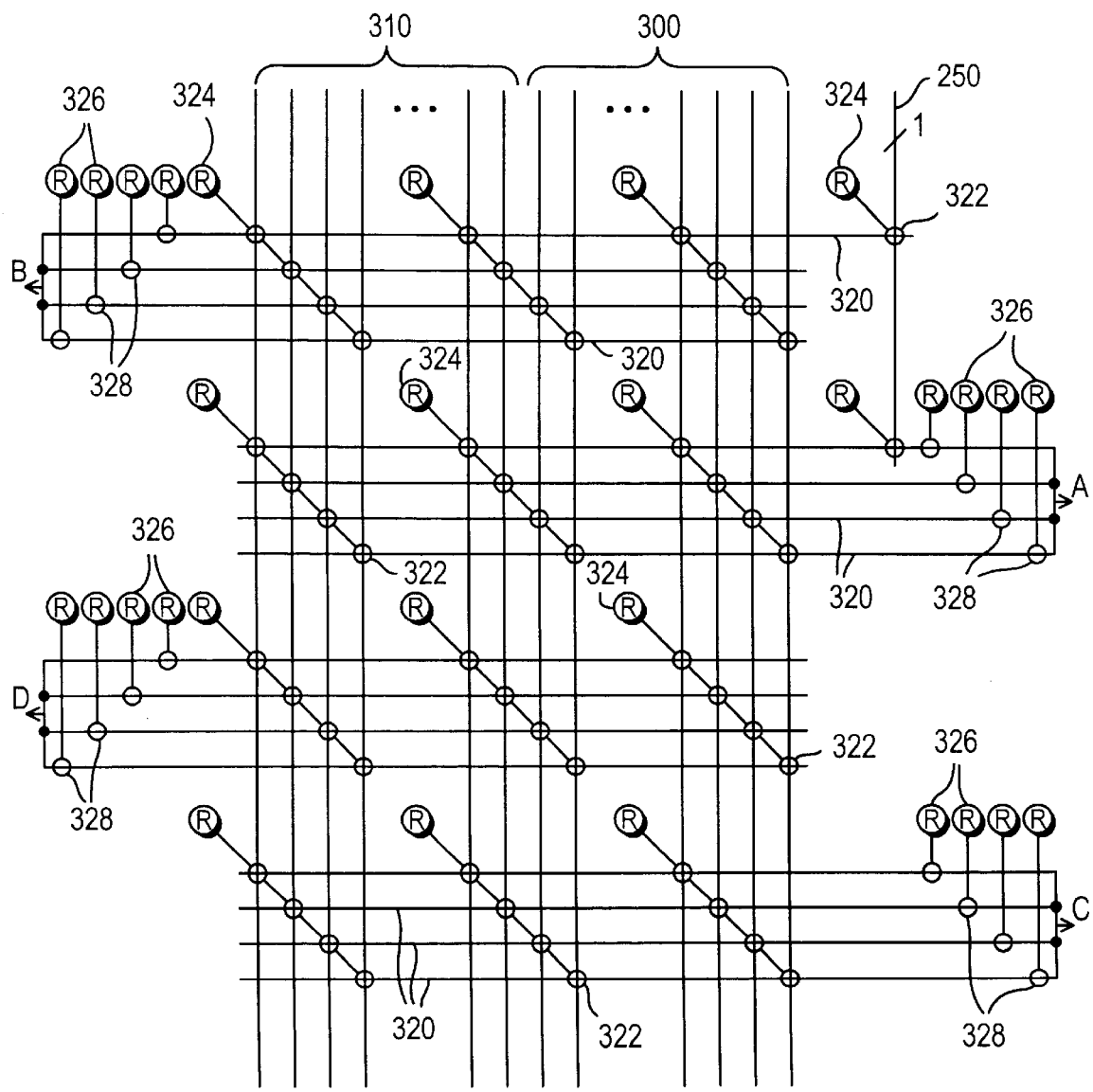
FIG. 4 is a simplified schematic block diagram of still other representative, illustrative interconnection resources for use on the device of FIGS. 1 and 2.

FIG. 4 shows representative conductors that are disposed between horizontally adjacent regions 20 for bringing signals to those regions from the other interconnection resources of the device and for providing local interconnections among the subregions 30 in those regions. Each group of such conductors includes 26 conductors 300 (whose signal sources are as shown in FIG. 3), a branch of one of the adjacent HNFL conductors 250, and ten local feedback conductors 310. Five of these local feedback conductors 310 receive their signals from five of the subregions 30 in the region 20 to the left of the depicted conductor group. The other five of these conductors 310 receive their signals from five of the subregions 30 in the region 20 to the right of the depicted conductor group.

Each subregion 30 has four main data signal inputs, sometimes referred to as inputs A–D. Any of conductors 300 and 310 can be used as the source(s) of the signals applied to the A and C inputs of the ten subregions 30 to the right of those conductors, and as the source(s) of the signals applied to the B and D inputs of the ten subregions 30 to the left of those conductors. Alternatively, the depicted HNFL conductor branch 250 can be used as the source of the signal applied to the A input of the top-most subregion to the right, and as the source of the signal applied to the B input of the top-most subregion to the left. Four intermediate conductors 320 are associated with each subregion input A–D. Each of the conductors 250, 300, and 310 that intersect these conductors 320 is connectable to one of the four conductors 320 that is associated with each input A–D. These connections are made by PLCs 322 that are controlled in groups of four by FCEs 324. (Exceptions to the group-of-four groupings are made for the connections to HNFL branch 250.) Thus a single FCE 324 is programmed to connect four conductors 300/310 to the four conductors 320 associated with each input A–D. A final selection of the signal applied to each input A–D is made by programming one of four FCEs 326 associated with that input to enable one of PLCs 328 associated with that input. (Alternatively, the signal on the HNFL branch 250 can be applied to an A or B input by appropriately programming associated FCEs 324 and 326.)

From the foregoing it will be seen that HNFL signals have two possible ways into the logic regions 20 served by the conductors 300, etc., shown in FIG. 4. One of these ways is the relatively fast routing through elements 276 and 278 in FIG. 3. The other way, for one particular HNFL conductor 250 and the top-most ones of the subregions 30 served by the conductors 300 shown in FIG. 4, is the even faster routing via the conductor branch 250 shown in FIG. 4 and the associated elements 322 and 328. Although somewhat slower, the first way is more general-purpose in that it enables any adjacent HNFL signal to get to at least large numbers of the inputs to the logic regions 20 served by the circuitry shown in FIG. 4. The other, faster way is more limited in that it only works for one of the adjacent HNFL signals and only allows input to one input terminal of one subregion 30 in each of the logic regions 20 served by the FIG. 4 circuitry.

Figure 5A:
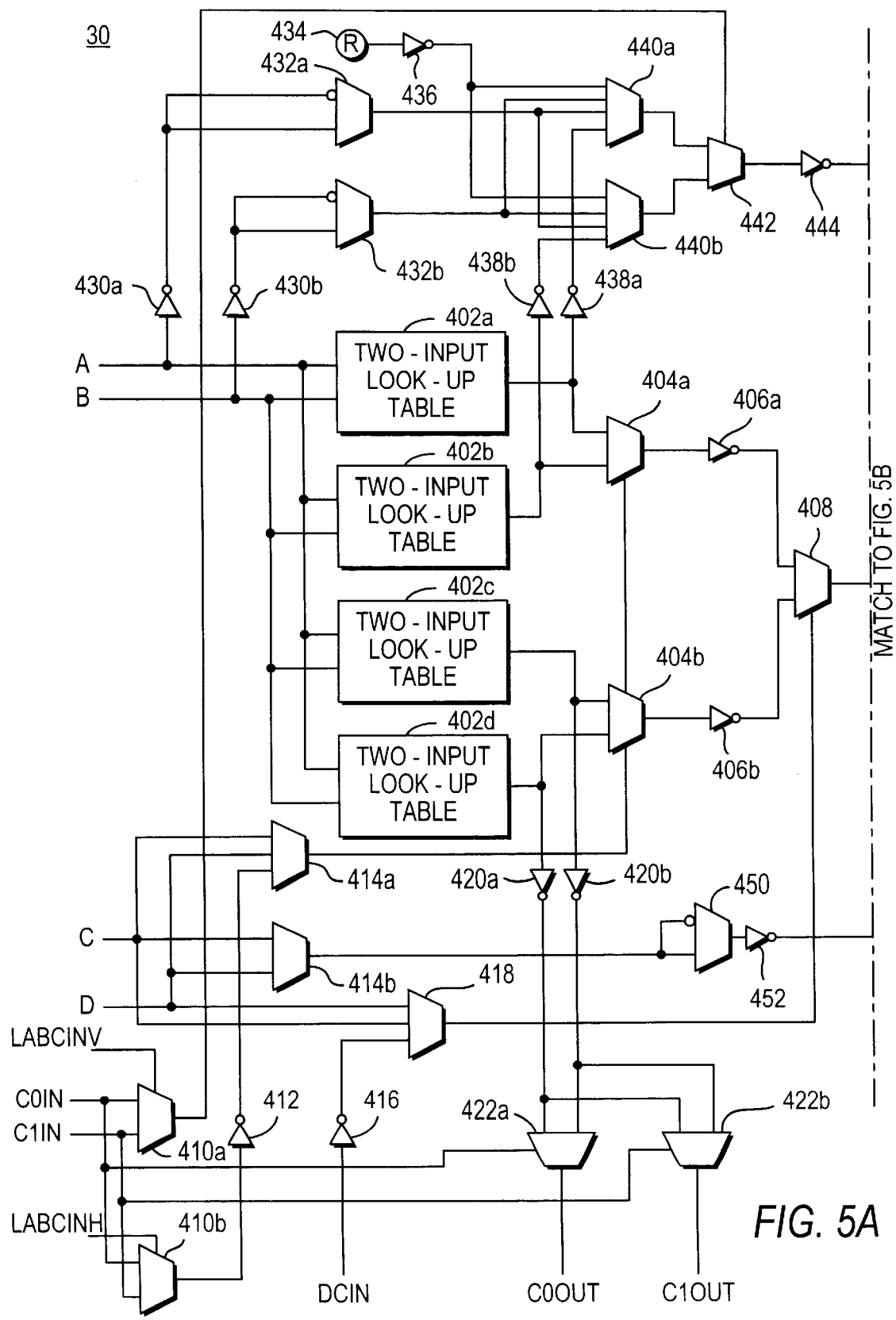
FIGS. 5A and 5B (sometimes referred to collectively as FIG. 5) are a simplified schematic block diagram of representative, illustrative programmable logic and related circuitry for use on the device of FIGS. 1 and 2 in accordance with the invention.
Figure 5B:
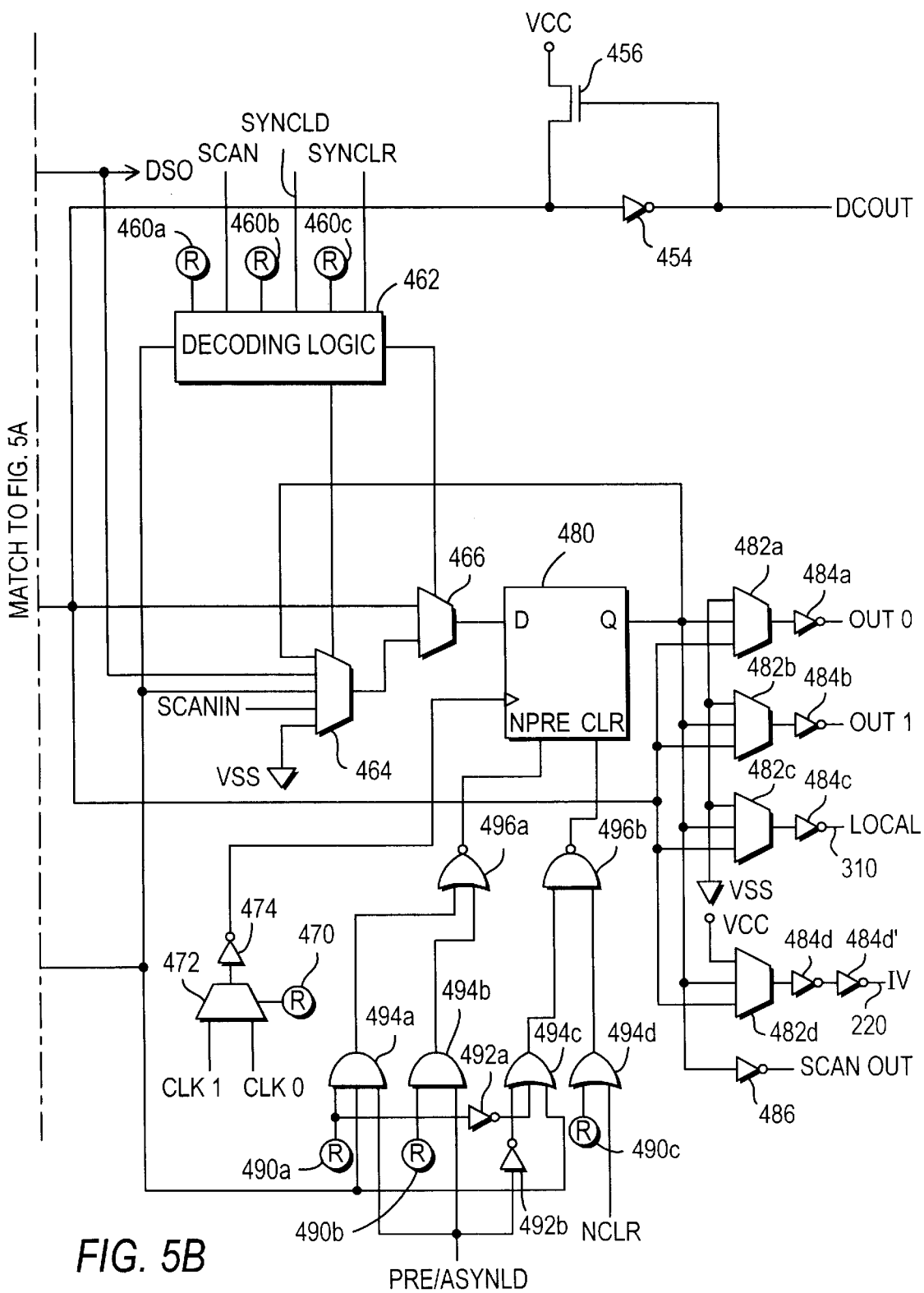

FIGS. 5A and 5B (sometimes referred to collectively as FIG. 5) show an illustrative embodiment of a representative subregion 30. The core of subregion 30 is a four-input look-up table (comprising elements 402, 404, 406, and 408) and a register 480. Although augmented with other features that are described later in this specification, the fundamental operation of subregion 30 is as a four-input look-up table that is programmable to produce a look-up table output signal (from PLC 408) that can be any logical combination of inputs A–D. The look-up table output signal can be output directly via any one or more of PLCs 482. Alternatively or in addition, the look-up table output signal can be registered by register 480 and then output via any of PLCs 482 that are not in use for outputting the unregistered look-up table output signal.

Considering representative subregion 30 now in more detail, the first stage of the four-input look-up table logic is constructed as four two-input look-up tables 402a–402d. Each of look-up tables 402 receives subregion inputs A and B and is programmable to produce an output signal which is any logical combination of those two input signals. The second stage of the four-input look-up table logic is constructed as two PLCs 404a and 404b. PLCs (e.g., multiplexers) 404 can be controlled by (1) the C input to subregion 30, (2) the D input to subregion 30, or (3) a carry-in signal selected by PLC 410b. The selection among options (1), (2), and (3) is made by appropriately programming PLC 414a. Option (3) is selected if the subregion is being used to perform one place of certain binary arithmetic operations (e.g., fast adder, counter, multiplier, and wide parity functions). The selection between options (1) and (2) may be based on signal timing considerations which will be discussed further in connection with elements 406, 408, and 418. The output signals of PLCs 404a and 404b are strengthened by inverting buffers 406a and 406b, respectively. (Although elements 404 are sometimes referred to as PLCs, they are dynamically rather than programmably controlled. In other words, rather than being programmably controlled by FCEs to always make the same signal selections once device 10 has been programmed, elements 404 may make different signal selections at different times during normal logic operation of the device because their control signal is a logic signal which can vary as a result of such logic operation. Nevertheless, elements such as 404 are generally referred to as PLCs for convenience herein. For greater accuracy such dynamically controlled elements may sometimes be alternatively referred to as logic connectors. Other examples of elements like elements 404 that are alternatively referred to as PLCs or logic connectors are elements 408, 410, 422, 442, 464, and 466.)

The last stage of the four-input look-up table logic is performed by PLC (e.g., multiplexer) 408. PLC 408 can be controlled by (1) the C input to subregion 30, (2) the D input to subregion 30, or (3) a so-called "direct connect" input DCIN from another adjacent or nearby subregion 30. The selection among just-mentioned options (1), (2), and (3) is made by appropriately programming PLC 418. Option (3) will be selected if the depicted subregion 30 is performing a logic function that is based (at least in part) on receiving a direct connect signal from another adjacent or nearby subregion. These direct connect connections between subregions may be used to facilitate the performance of wide fan-in logic functions or the like which require several subregions to be connected in series, sometimes referred to as a cascade chain. (See, for example, Cliff et al. U.S. Pat. No. 5,258,668 for additional discussion of cascade connections between logic modules in programmable logic devices. This reference is hereby incorporated by reference herein in its entirety.) The choice between options (1) and (2) can be based on signal timing considerations.

The signal timing considerations referred to in the two preceding paragraphs can include routing the slowest (i.e., last-to-arrive) of the data signals to be processed by the four-input look-up table logic to the last stage of that logic (i.e., the control input terminal of PLC 408). In this way, the earlier-arriving data signals can be processed by the first two stages of the look-up table logic in order to produce two already-buffered signals at the output terminals of buffers 406a and 406b. Then when the last-to-arrive data signal is received, PLC 408 is immediately able to output the buffer output signal selected by the state of the last-to-arrive signal. By applying the last-to-arrive data signal to the last stage of the look-up table logic, the look-up table output signal can be made available significantly earlier than if the last-to-arrive signal were applied to an earlier stage of the look-up table. This speed-up of the look-up table is further enhanced by placing buffers 406 upstream from PLC 408, rather than having the final look-up table output signal delayed by a buffer downstream from PLC 408.

Above-described elements 414a and 418 allow either input C or input D to be selected as the one to be applied to the final stage of the look-up table. The input C or D that is not thus selected for the final stage can be applied to the next-to-last stage of the look-up table. Because input C comes from the conductors 300/310 to the left of subregion 30 (see FIG. 4), while input D comes from the conductors 300/310 to the right of the subregion, the ability (using PLCs 414a and 418) to select either input C or input D as the last-to-arrive input eases routing constraints in the device. Thus the last-to-arrive signal can be routed to arrive via conductors 300/310 that are either to the left or right of the subregion.

Because the direct connect signal DCIN may also be relatively late to arrive (e.g., in the event that it is produced near the downstream end of a relatively long cascade chain), this signal is also among those selectable by PLC 418 for application to the last stage of the look-up table logic. This again helps speed up cascade chains.

Continuing with discussion of other elements in FIG. 5A, if subregion 30 is being used to perform one place of binary addition, counting, or the like, elements 402a and 402b can be programmed to produce two precursors of the sum of input A, input B, and a carry-in signal (from PLC 410b). PLC 404a is then controlled by the carry-in signal (via PLC 414a) to select the appropriate one of these two precursors as the sum-out signal. PLC 408 is controlled to always pass the sum-out signal to the circuitry of FIG. 5B. (This state of PLC 408 can be achieved by using the D input to the subregion to control PLC 408 and by programming all of the associated D input elements 328 (FIG. 4) to be off, which causes the D input to default high.) Elements 402c and 402d are programmed to produce two precursors of the carry-out that results from summing input A, input B, and the carry-in signal. These two precursors are respectively inverted by buffers 420a and 420b and applied in parallel to the two data inputs of each of PLCs (e.g., multiplexers) 422a and 422b. PLCs 422a and 422b respectively select precursors to output as C0OUT and C1OUT based on the C0IN and C1IN signals applied to subregion 30. The C0OUT and C1OUT signals of each subregion 30 are the C0IN and C1IN signals of the next subregion 30 in the carry chain. Two carry signals are thus propagated in parallel as part of circuitry for speeding up carry chains. This circuitry (which includes generation of the LABCINH signal for control of PLC 410b) is not part of the present invention and will thus not be described further herein. However, it is further described in Park et al. U.S. patent application Ser. No. 09/516,865, filed Mar. 2, 2000, which is hereby incorporated by reference herein in its entirety.

Elements 430, 432, 434, 436, 438, 440, 442, and 444 are provided as part of circuitry to facilitate and speed up the performance of multiplication operations by subregion 30. This circuitry (which includes generation of the LABCINV signal for control of PLC 410a) is also not part of the present invention and will thus not be described further herein. It is, however, further described in Pederson et al. U.S. patent application Ser. No. 09/517,350, filed Mar. 2, 2000, which is hereby incorporated by reference herein in its entirety.

Elements 450 and 452 are part of circuitry for allowing register 480 (FIG. 5B) to be used in what is called "lonely register" mode. This means that if register 480 is not needed for registering the look-up table output signal from PLC 408, the register can be alternatively used to register input C or input D. The C/D selection is made by PLC 414b. PLC 450 is programmed to propagate either the true or complement of the selected signal. Buffer 452 inverts and amplifies the selected signal.

Turning now to the portion of the representative subregion 30 circuitry that is shown in FIG. 5B, elements 454 and 456 allow the look-up table output signal (from PLC 408 in FIG. 5A) to be output as a direct connect output signal DCOUT of the subregion. The DCOUT signal of each subregion 30 is the DCIN signal of the next subregion in a cascade chain or series of subregions. Element 454 is an inverting buffer for the DCOUT signal, and element 456 is part of level-restoring circuitry for that signal.

Elements 460 and 462 are circuitry for controlling the states of PLCs 464 and 466 based on the programming of elements 460, the logical state of the output signal of buffer 452 (FIG. 5A), and the logical states of the SCAN, SYNCLD, and SYNCLR signals. The SCAN signal is a device-wide signal for placing the device in a scan test mode in which register 480 and other registers on the device are effectively connected in scan chains in order to read out their contents and thereby more readily test the device for proper operation. Thus when the SCAN signal is asserted, ecoding logic 462 controls PLCs 464 and 466 to apply the SCANIN signal to register 480. The SCANIN signal of each subregion 30 is the SCANOUT signal of the preceding subregion or other register circuitry in a scan chain. The Q output signal of register 480 is output via inverting buffer 486 as the SCANOUT signal of subregion 30.

SYNCLD and SYNCLR are signals that are preferably selected on a region-wide basis for the region 20 that includes subregion 30. These signals are used to cause decoding logic 462 to apply signals suitable for synchronous loading or synchronous clearing of register 480. For example, VSS (ground or logic 0) may be connected to the D input terminal of register 480 via PLCs 464 and 466 to cause synchronous clearing of the register. Other states of the inputs to logic 462 and the consequent outputs from that logic can cause register 480 to re-register its output signal, to register the so-called "direct sum-out" signal DSO from buffer 444 (FIG. 5A), or to operate in lonely register mode in which it registers the output signal of buffer 452 (FIG. 5A). Pederson U.S. pat. No. 5,835,998, which is hereby incorporated by reference herein in its entirety, shows an example of circuitry of the type that can be used for elements 460 and 462 to control elements like 464, 466, and 480 (in conjunction with elements like 490, 492, 494, and 496 (further described below)).

Elements 470, 472, and 474 allow either of two clock signals CLK0 or CLK1 to be selected as the clock signal applied to the clock input terminal of register 480. FCE 470 is programmed to cause PLC 472 to select one of the two clock signals, which is then inverted by inverting buffer 474 for application to register 480.

Elements 490–496 are programmable and otherwise operable to control register 480 to perform various preset, asynchronous load, and clear operations. Elements 490 are FCEs, elements 492 are inverters, elements 494a and 494b are AND gates, elements 494c and 494d are OR gates, element 496a is a NOR gate, and element 496b is a NAND gate. The PRE/ASYNLD signal is an asynchronous load control signal. The NCLR signal is a clear signal.

Each of PLCs 482a–c is programmable by FCEs (not shown) to output either VSS (logic 0), the Q output signal of register 480, or the unregistered look-up table output signal from PLC 408 (FIG. 5A). PLC 482d is similar, except that instead of VSS, it can output VCC (logic 1). The output signal of PLC 482a is applied by inverting buffer 484a to a first output lead OUT0 of subregion 30. The output signal of PLC 482b is applied by inverting buffer 484b to a second output lead OUT1 of subregion 30. The output signal of PLC 482c is applied by inverting buffer 484c to a LOCAL output lead of subregion 30. The output signal of PLC 482d is applied by inverting buffers 484d and 484d' to an interleaved vertical ("IV") conductor 220.

The destinations of the OUT0 and OUT1 signals will be described below in connection with FIG. 6. The LOCAL signal is applied to one of the local feedback conductors 310 (FIG. 4) to the left or right of the region 20 that includes subregion 30. In particular (and as has already been said), the LOCAL outputs of half the subregions 30 in each region 20 are applied to respective ones of the conductors 310 to the left of that region and the LOCAL outputs of the other half of the subregions in each region are applied to respective ones of the conductors 310 to the right of that region. In a manner somewhat like the LOCAL output signals, the IV output leads 220 of half the subregions 30 in each region 20 extend upwardly from that region, and the IV output leads 220 of the other half of the subregions extend downwardly from that region.

Figure 6:
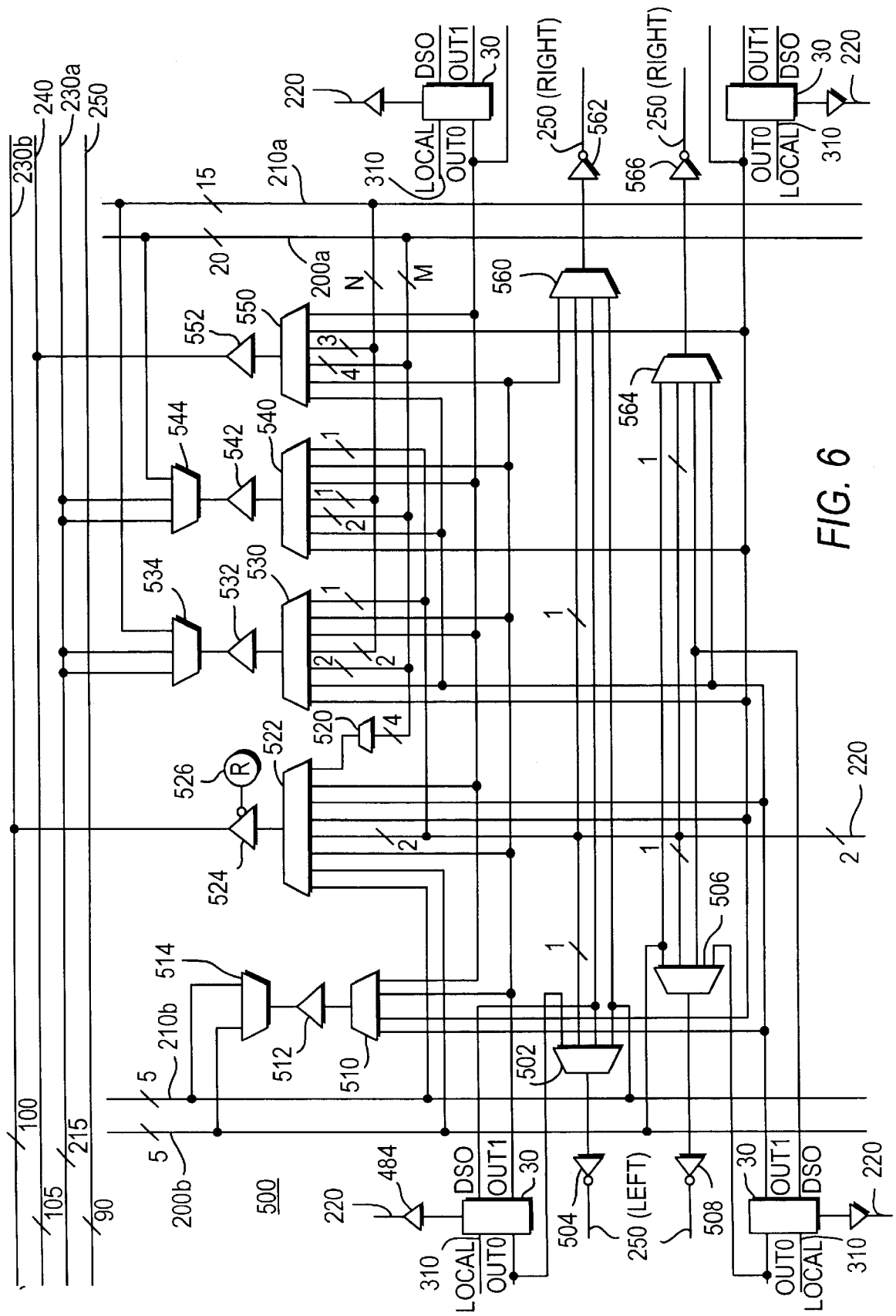
FIG. 6 is a simplified schematic block diagram of still more representative, illustrative interconnection resources for use on the device of FIGS. 1 and 2 in accordance with the invention.

FIG. 6 shows representative circuitry for making connections from subregions 30 to the interconnection conductors of the device, as well as between various types of interconnection conductors (other than those shown in FIG. 4 and thus already fully described). FIG. 6 may be characterized as showing a representative block 500 of driver circuitry. There is such a block of driver circuitry associated with each group of four subregions 30 that includes two subregions from each of two horizontally adjacent regions 20.

Considering first the various output signals of the upper subregion 30 on the left, the OUT0 signal of that subregion is applied to one input terminal of PLC 502. (Note that the OUT0 signal is also applied to the driver block to the left of the one shown in FIG. 6.) The other inputs to PLC 502 are (1) one of interleaved vertical signals 220 from a subregion 30 in the same column of regions 20 but in the row of regions above or below the row that includes the subregions shown in FIG. 6, (2) the direct sum-out signal DSO from the same subregion 30 as supplies its OUT0 signal, and (3) one of the fast half vertical conductors 210b associated with the column of driver circuit blocks 500 that is shown in part in FIG. 6. PLC 502 is programmable (by FCEs that are not shown in FIG. 6) to select one of its four input signals for application to inverting buffer 504. The output signal of buffer 504 is applied to one of the HNFL conductors 250 in the group of such conductors that is centered on the column of regions 20 that includes the subregions shown on the left in FIG. 6. In particular, the output signal of buffer 504 is applied to an HNFL conductor segment 250 that extends to the left from that column of regions 20. The output signal of inverting buffer 562 (discussed in more detail below) is applied to a segment of that same HNFL conductor 250 that extends to the right from that column of regions 20. (Although the left and right extending segments of each HNFL conductor 250 are actually separate conductors that are separately drivable, they are sometimes collectively referred to herein as a single HNFL conductor 250.)

The OUT1 output signal of the upper left-hand subregion 30 in FIG. 6 is applied to one input terminal of each of PLCs 510, 522, 530, 540, 550, and 560. The other inputs to PLC 560 are the same as above-described inputs (1)–(3) to PLC 502. PLC 560 is programmable to apply any one of its four input signals to inverting buffer 562 for application to a rightwardly extending segment of an HNFL conductor 250 as described in the immediately preceding paragraph.

The so-called LOCAL output signal of the upper left-hand subregion 30 in FIG. 6 is applied to one of the adjacent local feedback conductors 310. As has been mentioned, the LOCAL output signals of half the subregions 30 in each region 20 are applied to local feedback conductors 310 to the left of that subregion, and the LOCAL output signals of the other half of the subregions in each region are applied to local feedback conductors 310 to the right of that subregion.

The IV output signal of the upper left-hand subregion 30 in FIG. 6 is applied to an IV conductor 220 that extends to the corresponding position in the row above the row that is partly shown in FIG. 6.

The destinations of the output signals of the lower left-hand subregion 30 in FIG. 6 are generally similar to those described above for the upper left-hand subregion. The OUT0 signal is one of the inputs to PLC 506. (Again, this OUT0 signal is also applied to another driver block 500 to the left.) The other inputs to PLC 506 are (1) a signal from an adjacent fast global vertical conductor 200*b*, (2) an IV signal 220, and (3) the direct sum-out signal of the lower left-hand subregion 30. PLC 506 is programmable to apply any one of its input signals to inverting buffer 508 for application to another adjacent, leftwardly extending HNFL segment 250.

The OUT1 signal of the lower left-hand region 30 is applied to one input of each of PLCs 510, 522, 530, 540, 550, and 564. The other inputs to PLC 564 are the same as above-described inputs (1)–(3) to PLC 506, and the output of PLC 564 is applied (via buffer 566) to the rightwardly extending segment of the same HNFL conductor 250 that buffer 508 drives. The LOCAL output signal of the lower left-hand subregion 30 is applied to an adjacent local feedback conductor 310. The IV output signal of the lower left-hand subregion 30 is applied to an IV conductor 220 that extends to a corresponding location in an adjacent row below the row that includes the circuitry shown in FIG. 6.

The OUT0 signal of the upper right-hand subregion 30 shown in FIG. 6 is applied to one input terminal of each of PLCs 510, 522, 530, 540, and 550. This signal is also applied to another similar driver lock 500 to the right of the one shown in FIG. 6. The OUT1 and DSO output signals of the upper right-hand subregion 30 are also applied to the driver block to the right. The LOCAL output signal of the upper right-hand subregion 30 is applied to an adjacent local feedback conductor 310. The IV output signal of the upper right-hand subregion 30 is applied to an upwardly extending IV conductor 220.

The destinations of the output signals of the lower right-hand subregion 30 are generally similar. The OUT0 signal is applied to one input terminal of each of PLCs 510, 522, 530, 540, and 550, and to the driver block 500 to the right of what is shown in FIG. 6. The OUT1 and DSO signals are also applied to the driver block 500 to the right. The LOCAL output signal is applied to an adjacent local feedback conductor 310. And the IV output signal is applied to an IV conductor 220 extending down to a similar position in the adjacent row below the row that is shown in part in FIG. 6.

PLC 510 is programmable (by FCEs that are not shown) to select any one of its input signals for application to driver 512. The output signal of driver 512 is applied to PLC 514 (e.g., a demultiplexer) which is programmable by FCEs (not shown) to apply its input signal to any one of its output terminals. One output terminal of PLC 514 is connected to an adjacent fast global vertical conductor 200*b*. The other output terminal of PLC 514 is connected to an adjacent fast half vertical conductor 210*b*. From the foregoing it will be seen that elements 510, 512, and 514 make it possible to connect any one of the OUT1 signals of the subregions 30 on the left or the OUT0 signals of the subregions 30 on the right to either one of an adjacent fast global vertical conductor 200*b* or an adjacent fast half vertical conductor 210*b*. Thus elements 510, 512, and 514 allow any of the four subregions 30 served by the driver block 500 shown in FIG. 6 to drive either a fast global vertical conductor 200*b* or a fast half vertical conductor 210*b*.

The inputs to PLC 522 that have not already been described are as follows: (1) a signal from one of adjacent fast global vertical conductors 200*b*, (2) a signal from one of adjacent fast half vertical conductors 210*b*, (3) two interleaved vertical conductor signals 220 (one of which comes from the row above the row shown in part in FIG. 6, and the other of which comes from the row below the row shown in part in FIG. 6), and (4) a signal from one of four adjacent global vertical conductors 200*a* (the selection of that one-signal-of-four being made by PLC 520). Like other PLCs on device 10, PLC 522 is programmably controlled by FCEs (not shown) to select any one of its inputs for application to tri-state driver 524. Tri-state driver 524 is programmably controlled by FCE 526 to be either off (high output impedence) or on (able to pass and amplify the applied data input signal). The output signal of tri-state driver 524 is applied to an adjacent one of fast global horizontal conductors 230*b*. From the foregoing it will be seen that elements 522, 524, and 526 allow an output signal of any of the subregions 30 served by the driver block 500 shown in FIG. 6 to be driven onto one of the adjacent fast global horizontal conductors 230*b*. Alternatively, elements 522, 524, and 526 allow a signal from either an adjacent fast global vertical or fast half vertical conductor 200*b* or 210*b* to make a turn and be driven onto the above-mentioned fast global horizontal conductor 230*b*. As still another alternative, elements 522, 524, and 526 allow either of two interleaved vertical conductor signals 220 to be driven onto the above-mentioned fast global horizontal conductor 230*b*. And as a final alternative, elements 520, 522, 524, and 526 allow any one of four adjacent global vertical conductor signals 200*a* to make a turn and be driven onto the above-mentioned fast global horizontal conductor 230*b*.

Considering now the inputs to PLC 530 that have not already been discussed, two of the four signals that are applied to PLC 520 are also applied to PLC 530, as are signals from two of the adjacent half vertical conductors 210*a*. One of the interleaved vertical conductor signals that are applied to PLC 522 is also applied to PLC 530. Like other PLCs on device 10, PLC 530 is programmably controlled by FCEs (not shown) to apply any one of its inputs to driver 532 for amplification by that device. The output signal of driver 532 is applied to PLC 534 (e.g., a demultiplexer). PLC 534 is programmably controlled by FCEs (not shown) to apply its input signal to any one of its output leads. Two of the output leads of PLC 534 are respectively connected to two of the adjacent global horizontal conductors 230*a*. The third output lead of PLC 534 is connected to an adjacent half vertical conductor 210*a*. From the foregoing it will be seen that elements 530, 532, and 534 can be used to drive an output signal of any of the four subregions 30 shown in FIG. 6 out to adjacent ones of regular (normal-speed) horizontal and vertical conductors 230*a* and 210*a*. Alternatively, elements 530, 532, and 534 can be used to drive a signal from adjacent regular (normal-speed) conductors 200*a* and 210*a* or from an interleaved vertical conductor 220 onto a regular horizontal or vertical conductor 230*a* or 210*a*. Thus elements 530, 532, and 534 can be used, for example, to enable a signal to make a turn from a regular vertical conductor to a regular horizontal conductor.

The inputs to and outputs from elements 540, 542, and 544 are generally similar to those described above for elements 530, 532, and 534. The only differences are (1) a different one of the conductors 220 is connected to PLC 540 than to PLC 530, (2) only one of conductors 210a is connected to PLC 540, and (3) the third output of PLC 544 is applied to an adjacent global vertical conductor 200a rather than to a half vertical conductor 210a. Nevertheless, elements 540, 542, and 544 provide more of the same basic type of routing capability that elements 530, 532, and 534 provide.

The inputs to PLCs 550 that have not already been considered are signals from four of the adjacent conductors 200a and from three of the adjacent conductors 210a. Like other similar PLCs on device 10, PLC 550 is programmable (by FCEs that are not shown) to select any one of the applied signals for application to driver 552. Driver 552 amplifies the signal it receives and applies the amplified signal to one of the adjacent direct horizontal conductors 240. Thus elements 550 and 552 allow any of the subregions 30 shown in FIG. 6 or any of several adjacent vertical conductors 200a or 210a to drive an adjacent direct horizontal conductor 240. For example, elements 550 and 552 can be used to enable a signal to turn from a vertical conductor 200a or 210a to a horizontal conductor 240.

From the foregoing it will be seen that a programmable logic device 10 constructed in accordance with this invention has at least some interconnection resources that are provided in both a normal-speed form and a higher-speed ("fast") form. Where provided, both forms are preferably architecturally similar to one another. "Architecturally similar" means that generally the same type of routing is available using either form of the interconnection resource. A signal can get from the same source to the same destination via a path that is basically similar using either form of the interconnection resource. However, the signal travels significantly faster via the fast form of the resource than via the normal-speed form of the resource.

The fast form of an interconnection resource may be made faster in any of several ways. For example, fast conductors may be made wider and more widely spaced from one another than normal-speed conductors. In particular, fast conductors may be made about two to three times wider than normal-speed conductors. Alternatively or in addition, the spacing between fast conductors may be made about two to three times the spacing between normal-speed conductors. It may also be advantageous to use the thicker upper metal layers for the fast conductors, while leaving the regular routing in the thinner lower metal layers. Using these techniques the RC time constant for fast conductors can be reduced to about 20% of the RC time constant for normal-speed conductors. The drivers (e.g., 512 and 524) and pass gates serving fast conductors may be made larger and more powerful (e.g., than normal-speed drivers 532, 542, 552). For example, fast drivers may have transistor sizing approximately twice the normal-speed driver transistor sizing. In addition, whereas a normal-speed driver may be implemented using a driver with an output demultiplexer, an architecturally corresponding fast driver is preferably implemented as individual tristatable drivers to achieve better speed. The PLCs (e.g., multiplexers 510 and demultiplexers 514) connected to fast conductors may be made with fewer inputs (for multiplexers) or fewer outputs (for demultiplexers) than the corresponding components (e.g., 530 and 534) connected to normal-speed conductors. Fast conductors may have fewer taps and therefore less loading than corresponding normal-speed conductors. Any or all of these techniques may be used to make the fast interconnection resources significantly faster than the otherwise architecturally similar normal-speed resources. For example, a design objective that can be achieved in device 10 in accordance with this invention is to have the fast interconnection resources able to at least assist in providing substantially any interconnection (especially any relatively long interconnection) approximately twice as fast as that same connection can be made solely through the normal-speed interconnection resources.

A specific example of architecturally similar normal-speed and fast interconnection resources in device 10 is as follows: To convey a signal from a first subregion 30 in a first row and column of regions 20 to a second subregion 30 in second remote row and second remote column of regions 20 via normal-speed interconnection resources, use normal-speed elements 540, 542, and 544 to get from the first subregion to an adjacent normal-speed vertical conductor 200a. Use the normal-speed vertical conductor 200a to get from the row of the first subregion 30 to the row of the second subregion 30. In the destination row use normal-speed elements 530, 532, and 534 to get from the above-mentioned vertical conductor 200a to a normal-speed horizontal conductor 230a. At the destination column use normal-speed elements 270, 274, etc. to get into the input circuitry 300/320 of the destination subregion 30. In contrast, to make the same interconnection via the fast interconnection resources, use fast elements 510, 512, and 514 to apply the output signal of the first subregion 30 to an adjacent fast vertical conductor 200b or 210b. At the destination row use fast elements 522 and 524 to turn the signal from the fast vertical conductor to a fast horizontal conductor 230b. At the destination column use fast element 276 to get the signal from the fast horizontal conductor 230b into the input circuitry 300/320 of the destination subregion 30.

The foregoing will make it apparent that in addition to the fast conductors indicated by reference numbers with the suffix "b", the fast interconnection resources of device 10 include PLCs, drivers, etc., that primarily serve those fast conductors. Examples include PLCs 510, 514, 522, and 276, and drivers 512, 524, and 278. Examples of architecturally similar normal-speed PLCs and drivers (which primarily serve normal-speed conductors) are 530, 532, 534, 540, 542, 544, 550, 552, 270, and 274.

In addition to the provision of certain interconnection resources in architecturally similar fast and normal-speed forms, device 10 includes other interconnection resources that help to increase the overall speed of the device. An example of these resources are HNFL conductors 250 (also sometimes referred to as high-speed regional interconnection conductors) and the associated PLCs 502, 506, 560, 564 and drivers 504, 508, 562, and 566 that drive those conductors. Conductors 250 are fast because they are relatively short and therefore have few taps. The PLCs and drivers that drive them can be made fast (e.g., by virtue of the PLCs having relatively few inputs and the drivers being made relatively large and powerful).

Another example of interconnection resources that are provided on device 10 to increase the speed of the device are IV conductors 220 (also sometimes referred to as bridging interconnection conductors). These conductors provide relatively direct and short connections between adjacent or nearby rows of regions 20. They can be driven by relatively strong drivers 484. Where they can be used, they obviate the need to use longer and therefore slower general-purpose vertical interconnection conductors 200/210 to get from one row to another.

FIG. 7A shows portions of an illustrative embodiment of secondary signal conductor resource region 120 and related circuitry in more detail. (Additional elements that are present in the FIG. 7A circuitry are shown in FIG. 7B.) Four conductors 610 extend vertically along substantially the entire vertical dimension of device 10. Each of conductors 610 conveys a respective one of four clock signals from a respective one of four dedicated clock signal input pins 612-1 through 612-4, which are preferably located near the center of device 10 to help reduce clock signal skew throughout the device. The clock signals on conductors 610 are distributed horizontally to each row of regions 20, 40, etc. by branching horizontal clock conductors 620 adjacent to each row. Conductors 620 are among the conductors previously identified (e.g., in FIG. 3) by the reference number 260. The signals on conductors 620 are applied to the adjacent (and therefore associated) logic regions 20 or I/O cells 630.

Six additional conductors 640 extend vertically along substantially the entire vertical dimension of device 10. Each of conductors 640 conveys a respective one of six so-called fast signals. Each of these fast signals can come from either a respective one of six dedicated input pins 642-1 through 642-6 located near the center of device 10 or from the logic of selected logic regions 20-1/20-2 also located near the center of device 10. Except for having extra output leads for supplying the above-mentioned fast signals, logic regions 20-1 and 20-2 can be similar to the other logic regions 20 on device 10. A PLC 644 is associated with each input pin 642 for programmably selecting either the input pin signal or a logic region 20-1 or 20-2 signal as a fast signal. The output signal of each PLC 644 is applied to a respective one of conductors 640 via an associated buffer 646. The output signal of each PLC 644 is also applied to a respective one of six horizontal fast conductors 650 associated with the row that includes regions 20-1 and 20-2 and a respective one of six similar horizontal fast conductors 650 associated with the I/O row 40 that is associated with the logic region row that includes regions 20-1 and 20-2. (As was noted earlier in this specification, the full association of I/O rows 40 and logic region rows just alluded to for two such rows is as follows (see FIG. 1): (1) top-most I/O row 40 and top-most logic region row, (2) second from top I/O row 40 and fourth from top logic region row, (3) third from top I/O row 40 and seventh from top logic region how, (4) fourth from top I/O row 40 and tenth from top logic region row, and (5) bottom-most I/O row 40 and bottom-most logic region row.)

Logic region rows and I/O rows other than those described in the preceding paragraph with reference to regions 20-1 and 20-2 also have associated horizontal fast conductors 650. For each of those other logic region rows, the signal on each of the associated conductors 650 can come from either a respective one of conductors 640 or a logic region 20 in that row and adjacent to region 120. PLCs 648 are provided for making these further fast signal selections. For each I/O row 40 other than the one mentioned in the preceding paragraph, the signals on the associated conductors 650 are the same as the signals on the conductors 650 associated with the logic region row that is associated with that I/O row.

Conductors 650 are also among the conductors previously identified (e.g., in FIG. 3) by reference number 260. The signals on the conductors 650 associated with each logic region row or I/O row are applied to the logic regions 20 or I/O cells 630 in that row.

From the foregoing it will be seen that each fast conductor 650 signal associated with each row of logic regions 20 (and any I/O row 40 associated with that logic region row) can be either locally generated (by one of the logic regions 20 near the center of the row) or more globally generated (either by one of logic regions 20-1/20-2 or from an input pin 642). Allowing the fast conductors 640/650 to be driven by either input pins 642 or logic regions 20 allows some of the low-skew secondary signals to be driven by internally generated logic in addition to input pins. Allowing each fast conductor 640/650 to be preferably driven by just one input pin or just one special logic region reduces the amount of routing required to get a logic region output signal or an input pin signal onto the global secondary signal conductor network. Making the global clock signals directly driven by dedicated input pins 612 makes these signals as fast as possible. Choosing all of the dedicated sources 610/620/20-1/20-2 etc. to be near the center of the device reduces the amount of signal skew across the device. The possibility of locally sourcing the fast conductor 650 signals associated with each row of logic regions 20 allows device 10 to have many more secondary signals to work with (i.e., ten global signals plus up to N*6 local signals, where N is the number of rows of logic regions). Additionally, the local secondary signals that are sourced by the logic region(s) within the row will have smaller delay than those that need to be driven globally from the central spine.

In addition to above-described conductors 620 and 650, each row of logic regions 20 or I/O cells 630 has two local fast conductors 660 extending horizontally along its length. Conductors 660 are also among the conductors previously identified (e.g., in FIG. 3) by reference number 260. FIG. 7B shows the signal sources for these conductors. For each I/O cell row and the logic region row associated with that I/O cell row, the signals on the associated conductors 660 can come from either an input pin 662 near the center of that I/O cell row or a logic region 20 near the center of that logic region row. PLCs 664 select between these input pin and logic region signals. For each logic region row that is not associated with an I/O cell row, the conductor 660 signals can come from logic regions 20 near the center of that row.

Modifications to the circuitry shown in FIG. 7 could include having local row input pins (like input pins 662) in every logic region row that can drive the local secondary signals 650 and/or 660 for that row as an alternative to driving those conductors from logic regions 20 in the row. Another possibility is to have the local secondary signals 650/660 more finely grained or more coarsely grained (e.g., by having these signals grouped by half-row, or by grouping the local secondary signals in quadrants of device 10 rather than in individual rows).

FIG. 7 also shows the manner in which each I/O row 40 shares secondary signals 650/660 with the row of logic regions 20 associated with that I/O row. Thus the representative I/O row 40 shown near the top of FIG. 7 has the same secondary signals 650/660 as the associated logic region row directly below that I/O row. Similarly, the other I/O row 40 shown near the bottom of FIG. 7 has the same secondary signals 650/660 as the associated logic region row directly below that I/O row.

Figure 8:
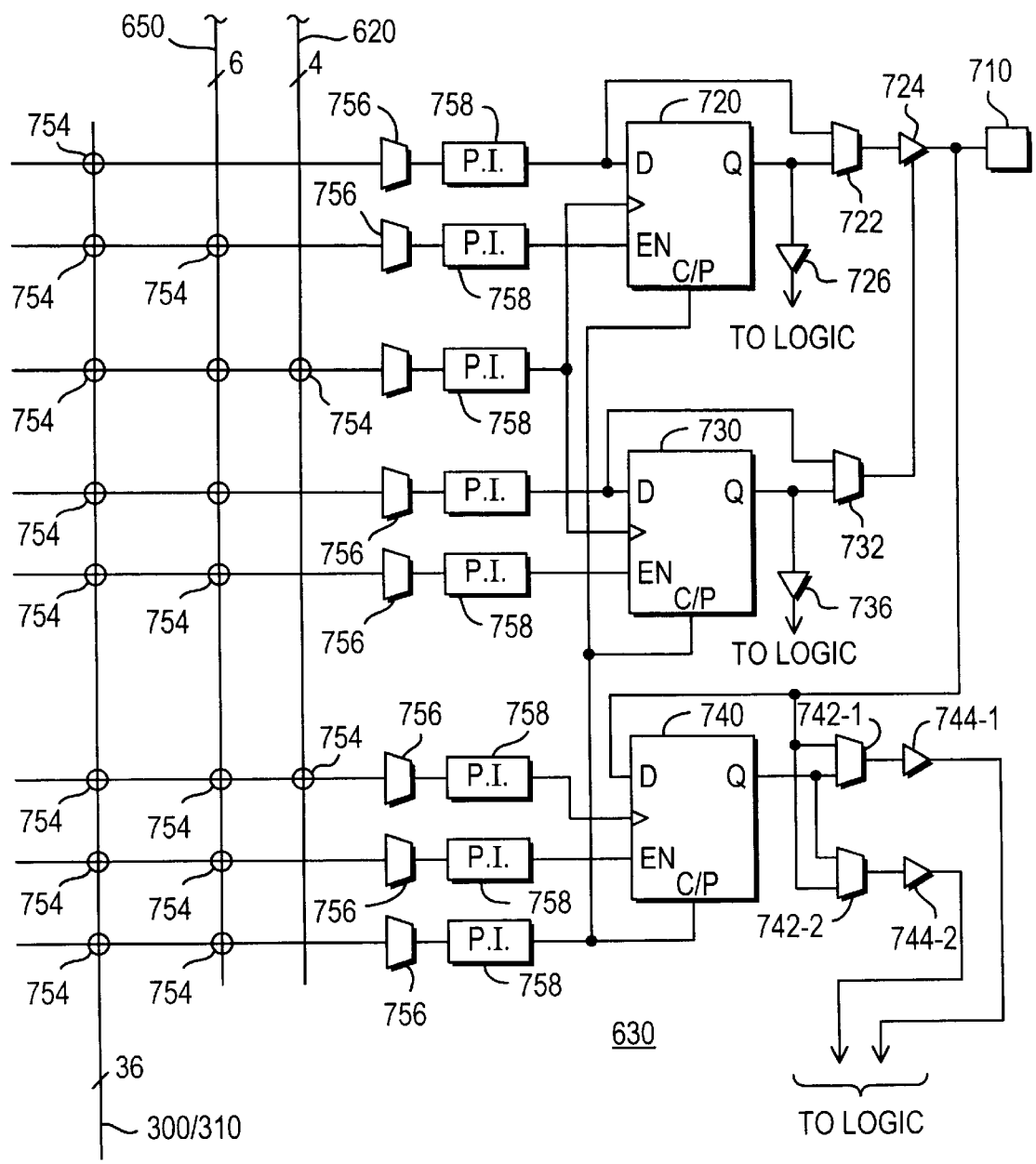
FIG. 8 is an even more detailed but still simplified schematic block diagram of an illustrative embodiment of representative portions of the FIG. 7 circuitry.

FIG. 7 also shows another aspect of the association of each I/O row 40 with a respective one of the rows of logic regions 20. This refers to the use of the region-feeding conductors 300 and the local feedback conductors 310 in the logic region row associated with each I/O row 40 as additional input signal sources for the I/O cells 630 in that I/O row 40. For example, the conductors 300/310 associated with logic region 20-1 in FIG. 7 are extended up to the I/O cell 630 above that logic region so that the signals on those conductors 300/310 can be used as additional inputs to that I/O cell. As another example, the conductors 300/310 associated with the logic region 20 shown near the upper right in FIG. 7 are extended up to the I/O cell 630 above that logic region so that the signals on those conductors 300/310 can be used as additional inputs to that I/O cell. FIG. 8, which will be described next, shows more detail regarding the construction of a preferred embodiment of a representative I/O cell 630, including the manner in which the various signals applied to such a cell can be used.

An illustrative embodiment of a typical I/O cell 630 is shown in more detail in FIG. 8. I/O cell 630 includes I/O pin 710, input register 740, output register 720, and tri-state control signal (or output enable) register 730. Each of registers 720, 730, and 740 has a data input D, a clock input, a clock enable input EN, a clear/preset input C/P, and a data output Q. Except for the data input of input register 740 (which comes from I/O pin 710), all of the inputs to registers 720, 730, and 740 are variously selectable from the signals on the four clock inputs 620 to the I/O cell, the six fast conductor 650 inputs to the I/O cell, and 36 conductors 300/310 available to the I/O cell. Circles 754 indicate the available connectivity between the various conductors 620/650/300/310 and the various register inputs. Each of PLCs 756 makes a selection of one signal from among the several connectable signals. Programmable invert elements 758 (which can be like circuitry 450 in FIG. 5A) allow each PLC 756 output signal to be inverted or not inverted, as desired by the user of the device.

As is apparent from FIG. 7 and the earlier discussion of that FIG., the conductors 300/310 shown in FIG. 8 are region-feeding conductors 300 and local feedback conductors 310 from the row of logic regions 20 associated with the I/O row 40 that includes the I/O cell 630 shown in FIG. 8. (The several I/O cells in each row 40 typically have conductors 300/310 from different ones of the regions 20 in the associated logic region row.) Conductors 620 and 650 in FIG. 8 are branches of the horizontal conductors 620 and 650 shown in FIG. 7 that are associated with the I/O row that includes the FIG. 8 I/O cell 630.

The same signal is used to clock both output register 720 and output enable register 730. All of registers 720, 730, and 740 have the same clear/preset input signal. Each register is programmable to either clear or preset in response to the clear/preset input signal.

The data output signal Q of output register 720 is applied to one input terminal of PLC 722. The other input to PLC 722 is the data input to register 720. Accordingly, PLC 722 can be used to apply to tri-state driver 724 an output signal of device 10 which has either been registered by register 720 or which has bypassed that register. The data output signal Q of output enable register 730 is applied to one input terminal of PLC 732. The other input to PLC 732 is the unregistered data input to register 730. The output signal of PLC 732 is applied to the tri-state control input terminal of tri-state driver 724. Accordingly, the tri-state driver control signal can be either the registered or unregistered data signal applied to register 730. The output signal of tri-state driver 724 is applied to I/O pin 710.

On the input side, an input signal from I/O pin 710 is applied to the data input terminal D of input register 740. That signal is also applied to one input terminal of each of PLCs 742-1 and 742-2. The other input to each of these PLCs is the Q output signal of input register 740. The output signal of PLC 742-1 is applied to the logic of device 10 via buffer 744-1. The output signal of PLC 742-2 is similarly applied to the logic of device 10 via buffer 744-2. For example, the output signal of each of buffers 744 may be applied to one or more of interconnection conductors 200a/b, 210a/b, 230a/b, 240, etc., of the device (e.g., via tri-state drivers or pass gate demultiplexers (not shown)). Thus either or both of paths 742-1/744-1 and 742-2/744-2 can be used for either the registered or unregistered input signal from I/O pin 710. In other words, pin 710 can feed the logic of device 10 in both its registered and unregistered form.

Registers 720 and 730 are also shown as having feedback paths to the logic of the device via buffers 726 and 736, respectively. These feedback paths can also connect to suitable interconnection conductors of the device as mentioned immediately above via tri-state drivers or pass gate demultiplexers.

Figure 9:
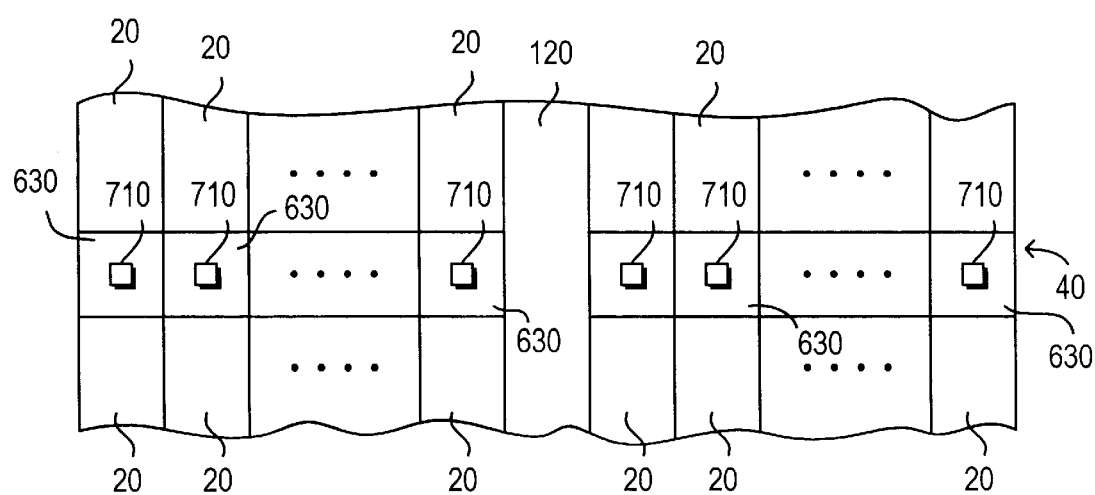
FIG. 9 is a more detailed but still simplified schematic block diagram of an illustrative embodiment of still other representative portions of the FIG. 1 circuitry in accordance with the invention.

FIG. 9 shows that I/O cells 630 and their associated I/O pins 710 are preferably distributed across each I/O row 40. In other words, these I/O pins 710 are not located around the periphery of device 10. Instead, they are located throughout the interior of the device by being spaced across each of the several I/O rows 40. This helps increase the number of I/O pins that can be provided on device 10.

Cascading subregions 30 as shown, for example, in FIG. 5 (i.e., using the DCIN and/or DCOUT signals) allows two or more subregions to be effectively used together (without recourse to the more general interconnection resources of the device) as a single look-up table having more than the four inputs that each subregion has individually. For example, two subregions 30 can be cascaded together to produce many (although not all) of the possible logical combinations of five, six, or seven inputs. In general, larger look-up tables have the advantage that they can produce the logical combinations of more inputs more rapidly than several smaller look-up tables that must be connected through the general interconnection resources of the device. On the other hand, larger look-up tables are wasteful when required to produce logical combinations of relatively small numbers of inputs. Thus the ability to cascade or directly connect relatively small (e.g., four-input) look-up tables represents a good compromise. When logical combinations of relatively large numbers of inputs must be produced, two or more subregions 30 can be cascaded together. On the other hand, when logical combinations of relatively small numbers of inputs must be produced, the subregions 30 can be used individually to avoid undue waste of look-up table resources. Of course, as has already been mentioned, not all logical combinations of more than four inputs can be produced by cascading two or more subregions 30.

Figure 10:
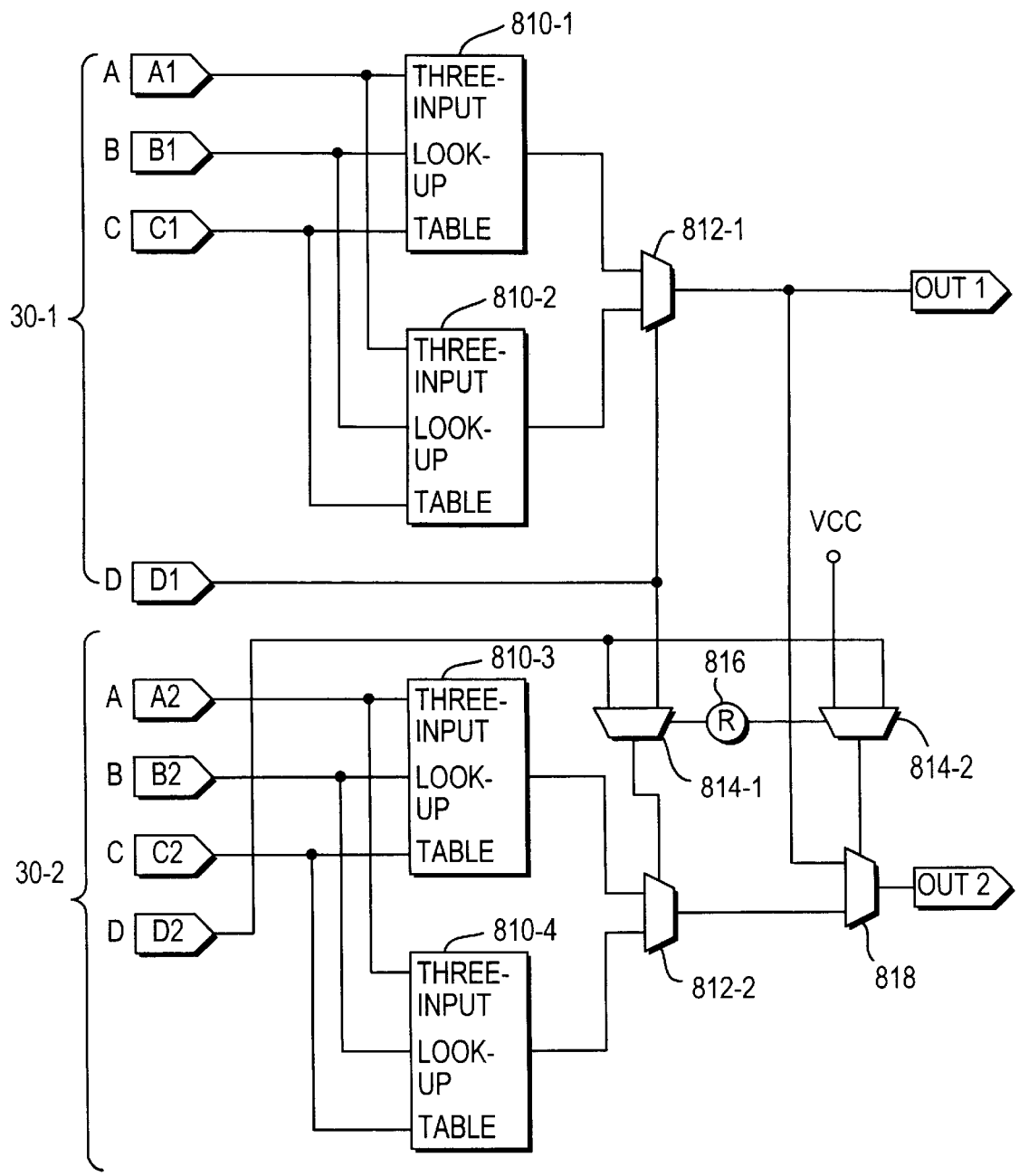
FIG. 10 is a simplified schematic block diagram of an alternative embodiment of portions of FIG. 5 in accordance with the invention.

FIG. 10 shows an alternative embodiment in which the four-input look-up tables in two subregions can be optionally interconnected via cascade-type direct connections to produce a true five-input look-up table (i.e., a look-up table which is capable of producing all logical combinations of five inputs). Elements 810-1 and 810-2 are two three-input look-up tables that form part of a first subregion 30-1. PLC 812-1 also forms part of that first subregion 30-1. Used by itself, subregion 30-1 can produce as OUT1 any logical combination of its four inputs A1–D1.

Elements 810-3 and 810-4 are two three-input look-up tables that form part of a second subregion 30-2. PLCs 812-2, 814-1, 814-2, and 818 and FCE 816 are additional components of subregion 30-2. When subregion 30-2 is to be used by itself, FCE 816 is programmed to cause PLC 814-1 to apply input D2 to the control input terminal of PLC 812-2 and to cause PLC 814-2 to apply fixed VCC (logic 1) to the control input terminal PLC 818. A logic 1 control input to PLC 818 causes that element to pass the output signal of PLC 812-2 to output terminal OUT2. This allows subregion 30-2 to be used by itself to produce as OUT2 any logical combination of the four inputs A2-D2 of subregion 30-2.

On the other hand, when all of the circuitry shown in FIG. 10 is to be used together as a five-input look-up table, FCE 816 is programmed to cause PLC 814-1 to apply input D1 to the control input terminal of PLC 812-2 and to cause PLC 814-2 to apply input D2 to the control input terminal of PLC 818. In addition, the same signals A–C are respectively applied to input terminals A1–C1 and A2–C2. This is done by appropriately programming the general interconnection resources (such as the elements shown in FIGS. 3 and 4) of device 10. The fourth input to the five-input look-up table is input D (applied to input terminal D1), and the fifth input to the five-input look-up table is input E (applied to input terminal D2). Based on input D, PLCs 812-1 and 812-2 select two signals from the four outputs of three-input look-up tables 810-1 through 810-4. From these two signals PLC 818 makes a final selection of one signal (OUT2) based on input E. Thus it will be seen that when used together in this manner, the circuitry shown in FIG. 10 can be used as a five-input look-up table to produce any logical combination of five inputs A–E.

Although FIG. 10 shows circuitry for optionally converting two four-input look-up tables to one five-input look-up table, the principle can be generalized to circuitry for optionally converting two M+1-input look-up tables to one M+2-input look-up table, where M is the number of inputs to each starting look-up table block such as element 810-1. In FIG. 10 M has a value of 3, but circuitry of the type shown in FIG. 10 can be easily modified for any other value of M such as 2, 4, 5, 6, 7, etc.

Figure 11:
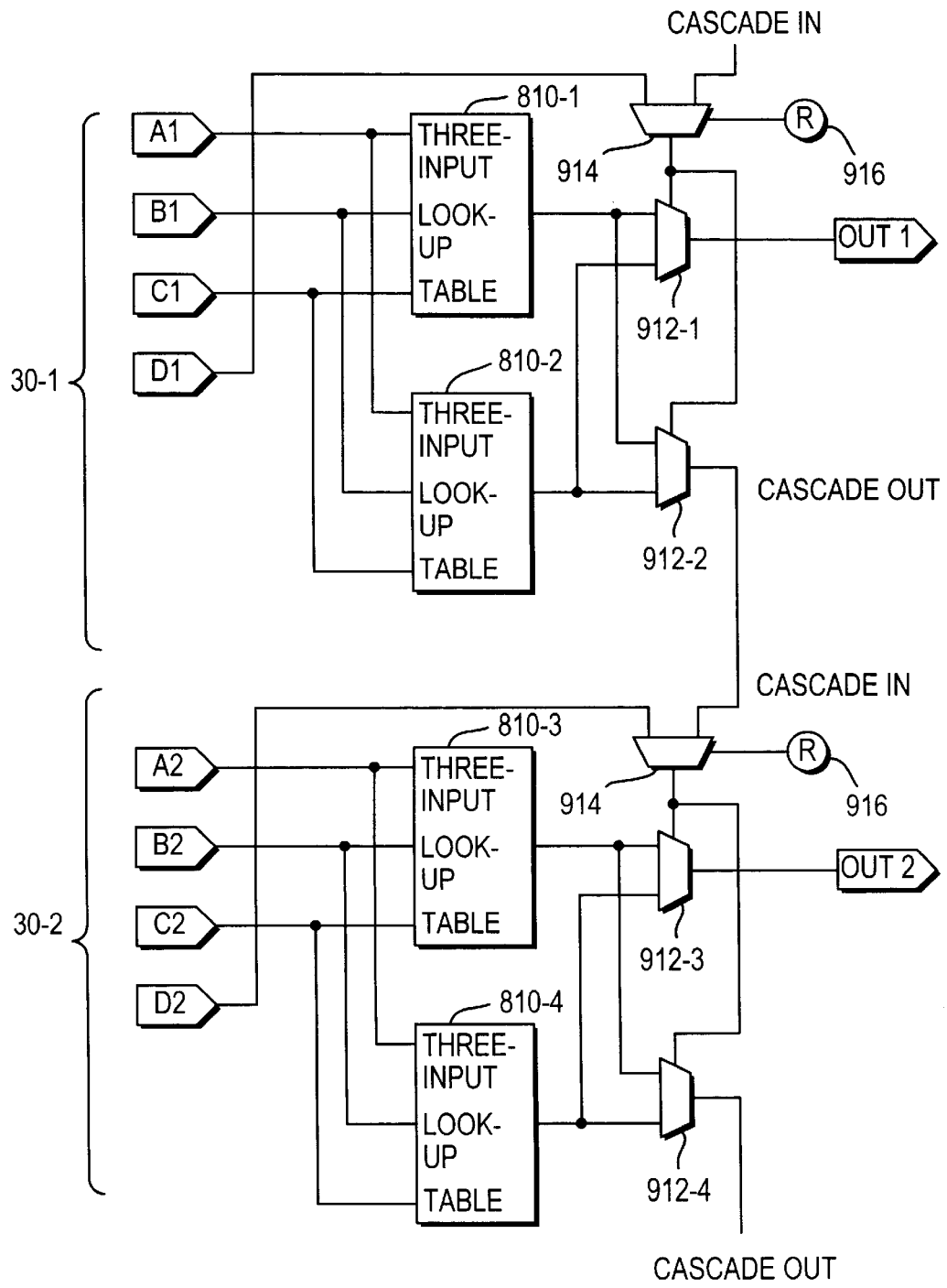
FIG. 11 is a simplified schematic block diagram of another alternative embodiment of portions of FIG. 5 in accordance with the invention.

Still other alternative circuitry for cascading subregions 30 is shown in FIG. 11. In the main embodiment shown in FIG. 5 the output signal of PLC 408 supplies both the direct connect output signal DCOUT and the main data output signal of the look-up table portion of the subregion 30 that includes that PLC 408. In the alternative embodiment shown in FIG. 11 each subregion 30-1 and 30-2 includes two PLCs 912-1 and 912-2 (in the case of subregion 30-1) and 912-3 and 912-4 (in the case of subregion 30-2). In each subregion 30 both of these PLCs 912 are controlled in parallel by the output signal of the PLC 914 in that subregion. In each subregion the PLC 914 is programmably controlled by the associated FCE 916 to output either the D input or the cascade input to that subregion. Lastly, in each subregion one of the PLCs 912 selects the main data output signal of the subregion and the second PLC 912 independently makes the same signal selection to produce the cascade output signal of the subregion. By providing two separate PLCs 912 in each subregion 30, neither the main data output signal nor the cascade output signal is loaded by the other of those two signals. This helps to speed up both of those signals. In other respects the embodiment shown in FIG. 11 can be logically the same as the main embodiment shown in FIG. 5.

FIGS. 10 and 11 have both been simplified as compared to the main embodiment shown in FIG. 5. It will be understood, however, that any of the other features shown in FIG. 5 can be used with features shown in FIGS. 10 and 11.

Figure 12:
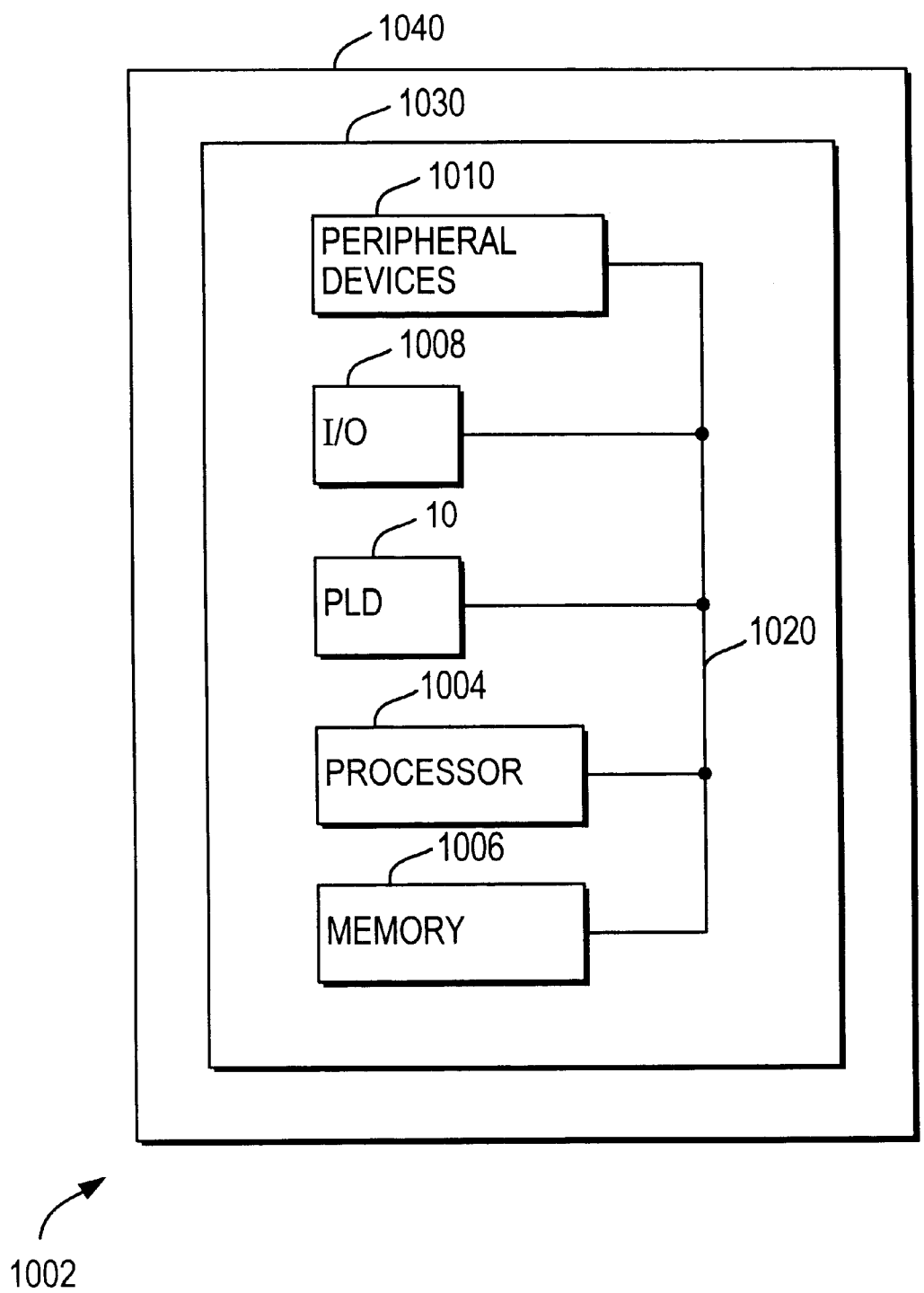
FIG. 12 is a simplified block diagram of an illustrative system employing a programmable logic device in accordance with the invention.

FIG. 12 illustrates a programmable logic device 10 of this invention in a data processing system 1002. Data processing system 1002 may include one or more of the following components: a processor 1004; memory 1006; I/O circuitry 1008; and peripheral devices 1010. These components are coupled together by a system bus 1020 and are populated on a circuit board 1030 which is contained in an end-user system 1040.

System 1002 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 1004. Programmable logic device 10 may also be used as an arbiter for arbitrating access to a shared resource in system 1002. In yet another example, programmable logic device 10 can be configured as an interface between processor 1004 and one of the other components in system 1002. It should be noted that system 1002 is only exemplary, and that the true scope and spirit of the invention should be indicated by the following claims.

Various technologies can be used to implement programmable logic devices 10 having the features of this invention, as well as the various components of those devices (e.g., the above-described PLCs and the FCEs that control the PLCs). For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the various components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the forgoing is only illustrative of the principles of the invention, and that various modifications can be made by those skilled in the art without departing from the scope and spirit of the invention. For example, the numbers of the various types of resources on device 10 can be different from the numbers present in the depicted and described illustrative embodiments. This applies to such parameters as the numbers of rows and columns of the various types of circuitry, the number of subregions 30 in each region 20, the numbers of the various types of interconnection conductors, the numbers and sizes of the PLCs provided for making interconnections between various types of interconnection conductors, etc. It will also be understood that various directional and orientational terms such as "vertical" and "horizontal," "left" and "right," "above" and "below," "row" and "column," and the like are used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of this invention. Terms like "region" and "subregion" are also used only as generic, relative terms, and other terms may be used for generally similar circuitry. Indeed, these terms may be used interchangeably herein in contexts in which a region/subregion hierarchy is not important. Alternatively, devices within the scope of this invention may have regions of programmable logic that are not divided into subregions. Although look-up table logic is employed in the illustrative embodiments shown and described herein, it will be understood that other types of logic may be used instead if desired. For example, sum-of-products logic, such as is the primary example considered in references like Pederson et al. U.S. Pat. No. 5,241,224 and Patel et al. U.S. Pat. No. 5,371,422 (both of which are hereby incorporated by reference herein in their entireties), may be used instead of look-up table logic. Although illustrated herein in the context of a particular programmable logic device architecture, it will be understood that various aspects of the invention are equally applicable to other programmable logic device architectures such as the various architectures shown in Freeman U.S. Pat. Re. No. 34,363, Cliff et al. U.S. Pat. No. 5,689,195, and Jefferson et al. U.S. Pat. No. 6,215,326, all of which are hereby incorporated by reference herein in their entireties.

What is claimed is:

1. A programmable logic device comprising:
a plurality of regions of programmable logic, each having a plurality of input terminals and at least one output terminal, and each being programmable to selectively perform any of a plurality of logic functions on input signals applied to the input terminals to produce an output signal applied to the output terminal; and
an interconnection network which is programmable to selectively connect the output terminal of substantially any of the regions to at least one of the input terminals of substantially any of the regions, the interconnection network including a first normal-speed portion which is programmable to selectively connect the output terminal of substantially any of the regions to at least one of the input terminals of substantially any of the regions, and a second high-speed portion which is programmable to optionally make at least part of a connection between the output terminal of substantially any of the regions and at least one of the input terminals of substantially any of the regions, wherein the high-speed portion includes a plurality of interconnection conductors, each being associated with circuitry that can programmably select any of at least a subplurality of the output terminals of the logic regions for connection to that interconnection conductor.

2. A programmable logic device comprising:
a plurality of regions of programmable logic, each having a plurality of input terminals and at least one output terminal, and each being programmable to selectively perform any of a plurality of logic functions on input signals applied to the input terminals to produce an output signal applied to the output terminal; and
an interconnection network which is programmable to selectively connect the output terminal of substantially any of the regions to at least one of the input terminals of substantially any of the regions, the interconnection network including a first normal-speed portion which is programmable to selectively connect the output terminal of substantially any of the regions to at least one of the input terminals of substantially any of the regions, and a second high-speed portion which is programmable to optionally make at least part of a connection between the output terminal of substantially any of the regions and at least one of the input terminals of substantially any of the regions, wherein the second high-speed portion is configured to optionally make at least part of a connection between the output terminal of substantially any of the regions and at least one of the input terminals of substantially any of the regions by providing signal routing which is alternative to at least part of routing for the same connection through the first normal-speed portion, the alternative routing through the second high-speed portion being substantially faster than routing through the first normal-speed portion to which the alternative routing is alternative.

3. A programmable logic device comprising:
a plurality of regions of programmable logic, each having a plurality of input terminals and at least one output terminal, and each being programmable to selectively perform any of a plurality of logic functions on input signals applied to the input terminals to produce an output signal applied to the output terminal; and
an interconnection network which is programmable to selectively connect the output terminal of substantially any of the regions to at least one of the input terminals of substantially any of the regions, the interconnection network including a first normal-speed portion which is programmable to selectively connect the output terminal of substantially any of the regions to at least one of the input terminals of substantially any of the regions, and a second high-speed portion which is programmable to optionally make at least part of a connection between the output terminal of substantially any of the regions and at least one of the input terminals of substantially any of the regions, wherein the regions are disposed on the device in a two-dimensional array of intersecting rows and columns of the regions, wherein the interconnection network includes a group of horizontal interconnection conductors associated with and extending along each of the rows, a group of vertical interconnection conductors associated with and extending along each of the columns, and programmable connectors configured to selectively interconnect horizontal and vertical interconnection conductors, and wherein a first subset of the conductors in each of the groups is configured to form part of the first normal-speed portion of the interconnection network, and a second subset of the conductors in each of the groups is configured to form part of the second high-speed portion of the interconnection network.

4. The device defined in claim 3 wherein the first subset in each of the groups includes more of the conductors of that group than the second subset of that group includes.

5. The device defined in claim 4 wherein the first subset in each of the groups includes in the range from about 67% to about 80% of the conductors in that group.

6. The device defined in claim 3 wherein the programmable connectors include a first subset of the connectors that are configured to selectively interconnect horizontal and vertical interconnection conductors in the first subsets of the conductors but not horizontal and vertical interconnection conductors in the second subsets of the conductors.

7. The device defined in claim 3 wherein the programmable connectors include a second subset of the connectors that are configured to selectively interconnect horizontal and vertical interconnection conductors in the second subsets of the conductors but not horizontal and vertical interconnection conductors in the first subsets of the conductors.

8. The device defined in claim 6 wherein the programmable connectors include a second subset of the connectors that are configured to selectively interconnect horizontal and vertical interconnection conductors in the second subsets of the conductors but not horizontal and vertical interconnection conductors in the first subsets of the conductors.

9. The device defined in claim 8 wherein each of the programmable connectors includes a signal driver, and wherein the signal drivers of the second subset of the connectors are larger and more powerful than the signal drivers of the first subset of the connectors.

10. The device defined in claim 3 wherein the conductors in the second subset of the conductors in each of the groups are wider than the conductors in the first subset of the conductors in that group.

11. The device defined in claim 3 wherein the conductors in the second subset of the conductors in each of the groups are spaced more widely from other conductors than the conductors in the first subset of the conductors in that group.

12. A programmable logic device comprising:
   a plurality of regions of programmable logic, each having a plurality of input terminals and at least one output terminal, and each being programmable to selectively perform any of a plurality of logic functions on input signals applied to the input terminals to produce an output signal applied to the output terminal; and
   an interconnection network which is programmable to selectively connect the output terminal of substantially any of the regions to at least one of the input terminals of substantially any of the regions, the interconnection network including a first normal-speed portion which is programmable to selectively connect the output terminal of substantially any of the regions to at least one of the input terminals of substantially any of the regions, and a second high-speed portion which is programmable to optionally make at least part of a connection between the output terminal of substantially any of the regions and at least one of the input terminals of substantially any of the regions, wherein the output terminal of each of the regions is substantially directly connectable to both the first normal-speed portion and the second high-speed portion of the interconnection network.

13. The device defined in claim 3 wherein the interconnection network further includes programmable circuitry configured to apply signals from at least some of the interconnection conductors associated with each of the regions to at least one input terminal of that region, the programmable circuitry including connection paths that are more direct for signals from conductors in the second subset of the conductors associated with that region than for signals from conductors in the first subset of the conductors associated with that region.

14. The device defined in claim 3 further comprising:
   a plurality of high-speed regional interconnection conductors associated with and extending along each of a plurality of subsets of multiple adjacent regions in each of the rows.

15. The device defined in claim 14 wherein each of the high-speed regional interconnection conductors is configured for programmable connection to the output terminal of the one of the associated regions that is approximately centered amid the multiple adjacent regions associated with that high-speed regional interconnection conductor.

16. The device defined in claim 15 wherein each of the high-speed regional interconnection conductors associated with each region is programmably connectable to at least one input terminal of substantially any of the regions associated with that high-speed local interconnection conductor.

17. The device defined in claim 3 further comprising a bridging interconnection conductor associated with each adjacent pair of regions in each column and configured to convey a signal from one of the regions in the associated pair only to programmable output circuitry associated with the other region in that pair, the output circuitry being configured to selectively apply a signal on the bridging interconnection conductor to the interconnection network in lieu of the signal from the output terminal of the other region in that pair.

18. A digital processing system comprising:
   processing circuitry;
   a memory coupled to the processing circuitry; and
   a programmable logic device as defined in claim 1 coupled to the processing circuitry and the memory.

19. A printed circuit board on which is mounted a programmable logic device as defined in claim 1.

20. The printed circuit board defined in claim 19 further comprising:
   a memory mounted on the printed circuit board and coupled to the programmable logic device.

21. The printed circuit board defined in claim 19 further comprising:
   processing circuitry mounted on the printed circuit board and coupled to the programmable logic device.

22. The device defined in claim 1 wherein the second high-speed portion is configured to optionally make at least part of a connection between the output terminal of substantially any of the regions and at least one of the input terminals of substantially any of the regions by providing signal routing which is alternative to at least part of routing for the same connection through the first normal-speed portion, the alternative routing through the second high-speed portion being substantially faster than routing through the first normal-speed portion to which the alternative routing is alternative.

23. The device defined in claim 1 wherein the regions are disposed on the device in a two-dimensional array of intersecting rows and columns of the regions, wherein the interconnection network includes a group of horizontal interconnection conductors associated with and extending along each of the rows, a group of vertical interconnection conductors associated with and extending along each of the columns, and programmable connectors configured to selectively interconnect horizontal and vertical interconnection conductors, and wherein a first subset of the conductors in each of the groups is configured to form part of the first normal-speed portion of the interconnection network, and a second subset of the conductors in each of the groups is configured to form part of the second high-speed portion of the interconnection network.

24. The device defined in claim 23 wherein the first subset in each of the groups includes more of the conductors of that group than the second subset of that group includes.

25. The device defined in claim 24 wherein the first subset in each of the groups includes in the range from about 67% to about 80% of the conductors in that group.

26. The device defined in claim 23 wherein the programmable connectors include a first subset of the connectors that are configured to selectively interconnect horizontal and vertical interconnection conductors in the first subsets of the conductors but not horizontal and vertical interconnection conductors in the second subsets of the conductors.

27. The device defined in claim 23 wherein the programmable connectors include a second subset of the connectors that are configured to selectively interconnect horizontal and vertical interconnection conductors in the second subsets of the conductors but not horizontal and vertical interconnection conductors in the first subsets of the conductors.

28. The device defined in claim 26 wherein the programmable connectors include a second subset of the connectors that are configured to selectively interconnect horizontal and vertical interconnection conductors in the second subsets of the conductors but not horizontal and vertical interconnection conductors in the first subsets of the conductors.

29. The device defined in claim 28 wherein each of the programmable connectors includes a signal driver, and wherein the signal drivers of the second subset of the connectors are larger and more powerful than the signal dirvers of the first subset of the connectors.

30. The device defined in claim 23 wherein the conductors in the second subset of the conductors in each of the groups are wider than the conductors in the first subset of the conductors in that group.

31. The device defined in claim 23 wherein the conductors in the second subset of the conductors in wach of the groups are spaced more widely from other conductors than the conductors in the first subset of the conductors in that group.

32. The device defined in claim 1 wherein the output terminal of each of the regions is substantially directly connectable to both the first normal-speed portion and the second high-speed portion of the interconnection network.

33. The device defined in claim 23 wherein the interconnection network further includes programmable circuitry configured to apply signals from at least some of the interconnection conductors associated with each of the regions to at least one input terminal of that region, the programmable circuitry including connection paths that are more direct for signals from conductors in the second subset of the conductors associated with the region than for signals from conductors in the first subset of the conductors associated with that region.

34. The device defined in claim 23 further comprising:
a plurality of high-speed regional interconnection conductors associated with and extending along each of a plurality of subsets of multiple adjacent regions in each of the rows.

35. The device defined in claim 34 wherein each of the high-speed regional interconnection conductors is configured for programmable connection to the output terminal of the one of the associated regions that is approximately centered amid the multiple adjacent regions associated with that high-speed regional interconnection conductor.

36. The device defined in claim 35 wherein each of the high-speed regional interconnection conductors associated with each region is programmably connectable to at least one input terminal of substantially any of the regions associated with that high-speed local interconnection conductor.

37. The device defined in claim 23 further comprising a bridging interconnection conductor associated with each adjacent pair of regions in each column and configured to convey a signal from one of the regions in the associated pair only to programmable output circuitry associated with the other region in that pair, the output circuitry being configured to selectively apply a signal on the bridging interconnection conductor to the interconnection network in lieu of the signal from the output terminal of the other region in that pair.

38. A digital processing system comprising:
processing circuitry;
a memory coupled to the processing circuitry; and
a programmable logic device as defined in claim 1 coupled to the processing circuitry and the memory.

39. A printed circuit board on which is mounted a programmable logic device as defined in claim 1.

40. The printed circuit board defined in claim 39 further comprising:
a memory mounted on the printed circuit board and coupled to the programmable logic device.

41. The printed circuit board defined in claim 39 further comprising:
processing circuitry mounted on the printed circuit board and coupled to the programmable logic device.

* * * * *